United States Patent
Kinoshita

(10) Patent No.: US 10,164,084 B2
(45) Date of Patent: Dec. 25, 2018

(54) SEMICONDUCTOR DEVICE AND METHOD OF MANUFACTURING THE SAME

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/412,943

(22) Filed: Jan. 23, 2017

(65) Prior Publication Data
US 2017/0263745 A1   Sep. 14, 2017

(30) Foreign Application Priority Data
Mar. 14, 2016   (JP) ................ 2016-049743

(51) Int. Cl.
H01L 29/78 (2006.01)
H01L 29/66 (2006.01)
H01L 29/16 (2006.01)

(52) U.S. Cl.
CPC ...... *H01L 29/7802* (2013.01); *H01L 29/1608* (2013.01); *H01L 29/66068* (2013.01)

(58) Field of Classification Search
None
See application file for complete search history.

(56) References Cited

U.S. PATENT DOCUMENTS

| | | | | |
|---|---|---|---|---|
| 2008/0246084 A1* | 10/2008 | Ono | ........... | H01L 29/0634 257/341 |
| 2015/0021670 A1* | 1/2015 | Schulze | ........... | H01L 29/7823 257/288 |
| 2015/0084063 A1* | 3/2015 | Van Brunt | ........ | H01L 29/66143 257/77 |

FOREIGN PATENT DOCUMENTS

| | | |
|---|---|---|
| JP | 2011-159797 | 8/2011 |
| JP | 2015-56644 | 3/2015 |

* cited by examiner

*Primary Examiner* — Su C Kim
*Assistant Examiner* — David S Wilbert

(57) ABSTRACT

A semiconductor device includes: an $n^+$-type drain region made of a wide-bandgap semiconductor material; an n-type epitaxial layer provided on the top surface of the drain region; an n-type first semiconductor region provided at an upper portion of the epitaxial layer and having a higher impurity concentration than the epitaxial layer; an n-type second semiconductor region provided on the first semiconductor region and having a higher impurity concentration than the first semiconductor region; p-type base regions surrounding to include an upper portion in the middle of the second semiconductor region; n-type source regions provided at upper portions of the base regions to form a channel; and a gate electrode which controls a surface potentials of the channels.

11 Claims, 16 Drawing Sheets

SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2016-049743 filed Mar. 14, 2016, the entire contents of which are incorporated by reference herein.

BACKGROUND OF THE INVENTION

1. Field of the Invention

The present invention relates to semiconductor devices and methods of manufacturing the semiconductor devices.

2. Description of the Related Art

Vertical MOSFETs using silicon carbide (SiC) used as a switching device have a stacked structure in which an n-type SiC layer is laminated on a top surface of an $n^+$-type SiC substrate. A gate structure and a source structure are provided at the top surface side of the SiC layer. A drain structure is provided in a bottom surface side of the SiC substrate. During an operation of a vertical MOSFET, a high electric field is applied to the top surface side of the SiC layer. Therefore, a junction gate field-effect transistor (JFET) region is provided so as to have immunity against the high electric field.

The provision of the JFET region leads to an increase in on-state resistance because of large resistance component of the JFET region to result in an increase of loss at the time of switching. In order to reduce the on-state resistance, JP 2011-159797A discloses a method of uniformly increasing a concentration of n-type impurities in a JFET region. JP 2015-056644A also discloses that a p-type region is deposited on an n-type drift region by epitaxial growth, and a $p^+$-type base region is buried in the p-type region by ion implantation, so as to minimize an increase in on-state resistance.

The uniform increase of concentration of the n-type impurities in the JFET region for reducing the on-state resistance, as disclosed in JP 2011-159797A, can decrease a reduction of a breakdown voltage to a certain extent, whereas the reduction of the breakdown voltage is unavoidable because of the increase of the impurity concentration. Further, the structure as disclosed in JP 2015-056644A in which the p-type region is deposited on the n-type drift region, and the $p^+$-type base region is buried in the p-type region, hinders the formation of an n-type region below the $p^+$-type base region, and a difficulty lies in suppressing spreading resistance of the JFET region.

SUMMARY OF THE INVENTION

In view of the above problems, an object of the present invention is to provide a wide-bandgap insulated-gate semiconductor-device having a minimized on-state resistance, while a lowering of breakdown voltage is protected, and a method of manufacturing the semiconductor device.

An aspect of the present invention inheres in a semiconductor device encompassing: a drain region of a first conductivity-type, made of a semiconductor material having a band gap greater than 2.0 eV at room temperature; an epitaxial layer of the first conductivity-type, provided on a top surface of the drain region and having a lower impurity concentration than the drain region; a first semiconductor region of the first conductivity-type, selectively buried in an upper portion of the epitaxial layer and having a higher impurity concentration than the epitaxial layer; a second semiconductor region of the first conductivity-type, provided on and overlapping with the first semiconductor region in a planar pattern and having a higher impurity concentration than the first semiconductor region; a base region of a second conductivity-type, buried in the second semiconductor region so as to surround a central upper portion of the second semiconductor region, the central upper portion is vertically protruding in a middle of the second semiconductor region in the planar pattern; a source region of the first conductivity-type, buried in an upper portion of the base region, defining a channel between the source region and the second semiconductor region; and a gate electrode which controls a surface potential of the channel.

Another aspect of the present invention inheres in a method of manufacturing a semiconductor device encompassing: growing an epitaxial layer of a first conductivity-type on a top surface of a semiconductor substrate of the first conductivity-type made of a semiconductor material having a band gap greater than 2.0 eV at room temperature, the epitaxial layer having a lower impurity concentration than the semiconductor substrate; selectively burying a base region of a second conductivity-type in an upper portion of the epitaxial layer; forming a first semiconductor region of the first conductivity-type having a higher impurity concentration than the epitaxial layer so as to overlap with a planar pattern of the base region, such that a bottom depth of the first semiconductor region is greater than that of the base region; forming a second semiconductor region of the first conductivity-type having a higher impurity concentration than the first semiconductor region on the first semiconductor region, such that a central protruding portion of the second semiconductor region is surrounded by the base region, a top end of the central protruding portion is exposed at a top surface of the epitaxial layer in the planar pattern, and a bottom depth of the second semiconductor region is greater than that of the base region; selectively burying a source region of the first conductivity-type in an upper portion of the base region to define a channel between the source region and the second semiconductor region; and forming a gate electrode which controls a surface potential of the channel.

DETAILED DESCRIPTION OF THE INVENTION

Figure 1:
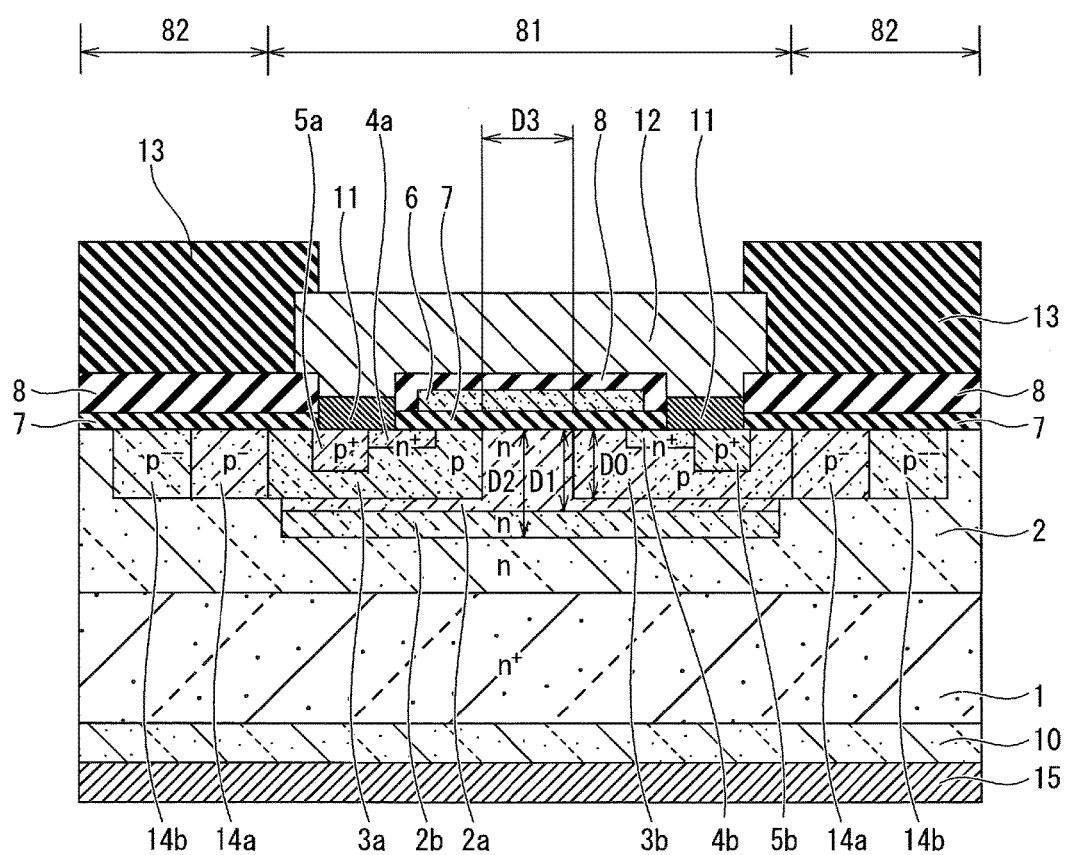
FIG. 1 is a cross-sectional view illustrating a structure of a semiconductor device according to a first embodiment of the present invention.

With reference to the Drawings, first and second embodiments of the present invention will be described below. In the Specification and the Drawings, the same or similar elements are indicated by the same or similar reference numerals. It should be understood that the Drawings are illustrated schematically, and the relationship between thicknesses and planar dimensions, and proportions of the respective layers are not drawn to scale. The specific thicknesses and dimensions should be considered in accordance with the following explanations. It should also be understood that the respective Drawings are illustrated with the dimensional relationships and proportions different from each other.

The first and second embodiments described below merely illustrate schematically semiconductor devices for fleshing out the meaning of the technical idea of the present invention, which is not limited to materials, shapes, structures, and relative positions of elements described herein. The technical idea of the present invention is to cover various modifications falling within the scope of the invention as defined by the following appended claims.

The conductivity types used in the semiconductor devices described in the Specification are merely examples, and not necessarily limited to those described herein. In the Specification and the appended Drawings, a layer or a region provided with the mark "n" denotes that electrons serve as majority carriers, and a layer or a region provided with the mark "p" denotes that holes serve as majority carriers. The sign "+" or "−" added to the mark "n" or "p" denotes that a semiconductor region has a higher or lower impurity concentration than a region without the sign "+" or "−" added. The respective elements denoted by the same mark "n" or "p" with the sign "+" or "−" have a similar concentration, but do not necessarily have the same concentration. With regard to Millar indices, the sign "−" denotes a bar attached to the following index to represent a negative index.

In the Specification, prepositions such as "on", "over", or terms such as "top" and "bottom" are defined with respect to a planar surface of the substrate, regardless of the orientation in which the substrate is actually held. For example, elements described as being on "top" and "bottom" sides would be oriented on "left" and "right" sides when a semiconductor device in one drawing is turned over 90 degrees, and oriented on the opposite sides when turned over 180 degrees.

First Embodiment

As illustrated in FIG. 1, a semiconductor device according to a first embodiment of the present invention includes an active area 81, and a breakdown-voltage-improving area 82 provided on the circumference of the active area 81. The semiconductor device according to the first embodiment basically includes an $n^+$-type semiconductor substrate 1, and an n-type epitaxial layer 2 grown on the top surface of the semiconductor substrate 1 and having a lower impurity concentration than the semiconductor substrate 1.

The semiconductor substrate 1 and the epitaxial layer 2 may each be made of a semiconductor material having a greater band gap than silicon (Si), such as SiC, gallium nitride (GaN), diamond, and aluminum nitride (AlN), of which the band gap is greater than 1.1 eV. It has been reported that the band gap at room temperature is 2.23 eV for 3C—SiC, 3.26 eV for 4H—SiC, 3.02 eV for 6H—SiC, 3.4 eV for GaN, 5.5 eV for diamond, and 6.2 eV for AlN.

A semiconductor having a wide band gap of 2.0 eV or greater may be used for the semiconductor substrate 1 and the epitaxial layer 2. As for LEDs, a band gap of 2.5 eV or greater is defined as a "wide band gap". According to the present invention, a preferred range of the band gap for the semiconductor defined as a wide band gap at room temperature is greater than or equal to 2.23 eV for 3C—SiC. The first embodiment is illustrated by the case in which the semiconductor substrate 1 is a SiC substrate, and the epitaxial layer 2 is a SiC epitaxial layer.

The semiconductor substrate 1 serves as a drain region. A backside electrode (drain electrode) 10 is laminated on the bottom surface of the semiconductor substrate 1. The thickness of the epitaxial layer 2 serving as a drift region is approximately 10 for example.

A MOS structure (element structure) is provided at an upper portion of the epitaxial layer 2. An n-type semiconductor region (first semiconductor region) 2b having a higher impurity concentration than the epitaxial layer 2, is buried in a part of the upper portion of the epitaxial layer 2. An n-type semiconductor region (second semiconductor region) 2a having a higher impurity concentration than the semiconductor region 2b, is buried in an upper portion of the semiconductor region 2b. A plurality of p-type base regions 3a and 3b are selectively buried in the upper portion of the semiconductor region 2a such that the middle of the semiconductor region 2a projecting upward is surrounded by the base regions 3a and 3b in the planar pattern.

Although FIG. 1 exemplifies the case in which the respective semiconductor regions 2a and 2b are buried only in the active area 81, the semiconductor regions 2a and 2b may further extend into the breakdown-voltage-improving area 82.

The semiconductor region 2a overlaps with the semiconductor region 2b in the planar pattern such that the bottom of the semiconductor region 2a is in contact with the semiconductor region 2b. The middle of the semiconductor region 2a projecting upward and interposed between the adjacent base regions 3a and 3b serves as a JFET region. Because the semiconductor region 2a has a central vertical portion protruding perpendicularly from a lower-laying flat portion so as to implement a topology of an inverted T shape in a cross-sectional view, the base region 3a and the base region 3b sandwich the central protruding portion of the semiconductor region 2a, such that the bottoms of the base regions 3a and 3b are in contact with the upper surface of the lower-laying flat portion of the semiconductor region 2a.

The width of the respective base regions 3a and 3b is approximately 7 for example. The depth D0 of the bottom of the respective base regions 3a and 3b measured from the top surface side of the epitaxial layer 2, as defined in FIG. 1, is approximately 0.4 for example. The distance D3 between the adjacent base regions 3a and 3b is approximately 1.5 for example.

The depth D1 of the bottom of the semiconductor region 2a measured from the top surface of the epitaxial layer 2, as defined in FIG. 1, is approximately 0.6 for example. The depth D1 of the bottom of the semiconductor region 2a is preferably at least 0.15 greater than the depth D0 of the bottom of the base regions 3a and 3b. The semiconductor region 2a having the bottom depth D1 at least 0.15 µm greater than the bottom depth D0 of the base regions 3a and 3b, can decrease spreading resistance from JFET, so as to effectively decrease the on-state resistance while keeping the breakdown voltage.

The depth D2 of the bottom of the semiconductor region 2b measured from the top surface of the epitaxial layer 2, as defined in FIG. 1, is approximately 0.7 for example. The depth D2 of the bottom of the semiconductor region 2b is preferably at least 0.3 greater than the depth D0 of the bottom of the base regions 3a and 3b. The semiconductor region 2b having the bottom depth D2 at least 0.3 µm greater than the bottom depth D0 of the base regions 3a and 3b, can decrease spreading resistance from JFET, so as to effectively decrease the on-state resistance while keeping the breakdown voltage.

When the impurity concentration of the semiconductor region 2a is defined as $N_{d1}$ cm$^{-3}$ and the impurity concentration of the semiconductor region 2b is defined as $N_{d2}$ cm$^{-3}$, the depth D1 of the bottom of the semiconductor region 2a is preferably at least $5.5 \times 10^3 / N_{d1}^{0.5}$ µm greater than the depth D0 of the bottom of the base regions 3a and 3b. The semiconductor region 2a having the bottom depth D1 at least $5.5 \times 10^3 N_{d1}^{0.5}$ µm greater than the bottom depth D0 of the base regions 3a and 3b, can prevent depletion of JFET, so as to effectively decrease the on-state resistance while keeping the breakdown voltage.

The depth D2 of the bottom of the semiconductor region 2b is preferably at least $6.5 \times 10^3 / N_{d2}^{0.5}$ µm greater than the depth D0 of the bottom of the base regions 3a and 3b. The semiconductor region 2b having the bottom depth D2 at least $6.5 \times 10^3 / N_{d2}^{0.5}$ µm greater than the bottom depth D0 of the base regions 3a and 3b, can prevent depletion of JFET, so as to effectively decrease the on-state resistance while keeping the breakdown voltage.

The upper portions of the base regions 3a and 3b are provided with n$^+$-type source regions 4a and 4b to define a channel between the source regions 4a and 4b and the semiconductor region 2a. The upper portions of the base regions 3a and 3b are further provided with p$^+$-type base contact regions 5a and 5b in contact with the source regions 4a and 4b. The base contact regions 5a and 5b are located closer to the breakdown-voltage-improving area 82 than the source regions 4a and 4b.

A gate electrode 6 is disposed on a gate insulating film 7, the gate insulating film 7 is laminated on the top surface of the base regions 3a and 3b. The base regions 3a and 3b serve as the channels defined between the source regions 4a and 4b and the semiconductor region 2a. As illustrated in FIG. 1, the gate electrode 6 may also be allocated, via the gate insulating film 7, on the top surface of the semiconductor region 2a sandwiched between the adjacent base regions 3a and 3b. The gate electrode 6 controls surface potentials of the channels between the source regions 4a and 4b and the semiconductor region 2a.

Although FIG. 1 exemplifies only a single MOS structure in the active area 81, a plurality of MOS structures may be arranged in parallel in the active area 81.

An interlayer insulating film 8 covers the gate electrode 6 and other regions on the top surface side of the epitaxial layer 2. A source electrode 11 is arranged in contact with the source regions 4a and 4b and the base contact regions 5a and 5b via contact holes cut in part of the interlayer insulating film 8 and penetrating the gate insulating film 7. The source electrode 11 is electrically insulated from the gate electrode 6 by the interlayer insulating film 8.

An electrode pad 12 is stacked on the source electrode 11 to be electrically connected to the source electrode 11. The periphery of the planar pattern of the electrode pad 12 terminates at the boundary between the active area 81 and the breakdown-voltage-improving area 82. A protection film (passivation film) 13 having a function to prevent discharge is laminated on the breakdown-voltage-improving area 82 to cover the endmost portion of the electrode pad 12 toward the breakdown-voltage-improving area 82. The protection film 13 used may be a silicon oxide film or an insulating film such as polyimide.

In the breakdown-voltage-improving area 82, an annular p$^-$-type region 14a and an annular p$^-$-type region 14b are buried in the upper portion of the epitaxial layer 2. The p$^-$-type region 14a and the p$^-$-type region 14b implement a double-zone junction termination extension (JTE) structure. The double-zone JET structure is a structure in which two p-type regions having different impurity concentrations are arranged in parallel and brought in contact with each other. The surface of the JTE structure is electrically insulated from a surface-interconnection structure of the active area 81 by the interlayer insulating film 8.

The p$^-$-type region 14a is in contact with the respective base regions 3a and 3b so that the p$^-$-type region 14a surrounds the periphery of the respective base regions 3a and 3b. The annular p$^-$-type region 14b is in contact with the p$^-$-type region 14a so that the p$^-$-type region 14b surrounds the periphery of the annular p$^-$-type region 14a. Namely, the peripheries of the p$^-$-type region 14a and the p$^-$-type region 14b are sequentially arranged in concentrically parallel along the radial direction from the active area 81 to the breakdown-voltage-improving area 82 to surround the base regions 3a and 3b in the planar pattern. The impurity concentration of the p$^-$-type region 14a is lower than that of the base regions 3a and 3b. The impurity concentration of the p⁻-type region 14b is lower than that of the p⁻-type region 14a.

When a positive voltage is applied between the gate and the source, inversion-channel layers are formed in the surface layers of the channels defined in the base regions 3a and 3b immediately below the gate electrode 6, and then the semiconductor device according to the first embodiment becomes the on-state. At the same time, a current path is formed in which a current flows through the source electrode 11, the base contact region 5a, the source region 4a, the inversion-channel layer in the surface layer of the base region 3a, the semiconductor region 2a, the semiconductor region 2b, the epitaxial layer 2, the semiconductor substrate 1, and the drain electrode 10. In addition, a current path is formed in which a current flows through the source electrode 11, the base contact region 5b, the source region 4b, the inversion-channel layer in the surface layer of the base region 3b, the semiconductor region 2a, the semiconductor region 2b, the epitaxial layer 2, the semiconductor substrate 1, and the drain electrode 10. Accordingly, the current flows from the drain electrode 10 toward the source electrode 11.

Figure 2:
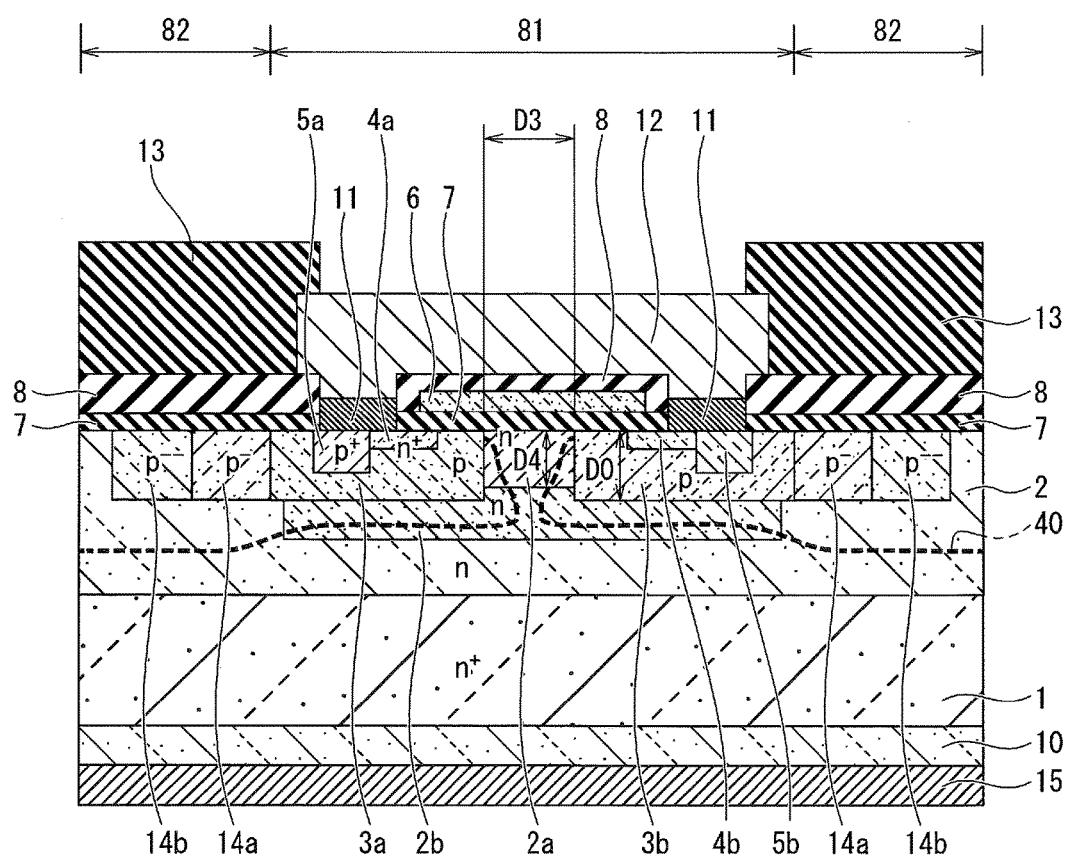
FIG. 2 is a cross-sectional view of a structure of a silicon carbide semiconductor device in the on-state according to a comparative example.

With reference to FIG. 2, a structure of a semiconductor device according to a comparative example in which a depth D4 of the bottom of the semiconductor region 2a is less than the depth D0 of the bottom of the base regions 3a and 3b, is compared with that of the semiconductor device according to the first embodiment as illustrated in FIG. 1. When the semiconductor device of the comparative example is in the on-state, a pair of depletion layers 40 spread around the corners of the bottoms of the base regions 3a and 3b, since the depth D4 of the bottom of the semiconductor region 2a is less than the depth D0 of the bottom of the base regions 3a and 3b. The spread of the depletion layers 40 narrows the passage of the current to increase resistance.

Figure 3:
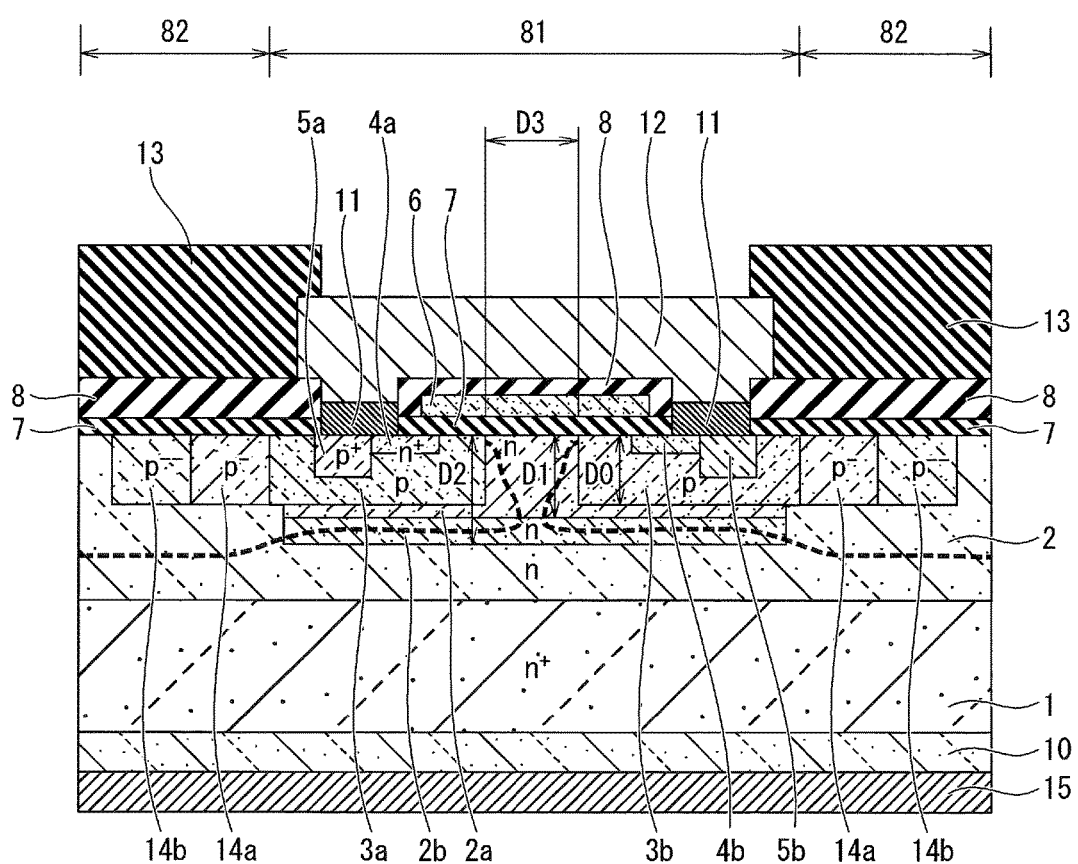
FIG. 3 is a cross-sectional view illustrating a structure of a silicon carbide semiconductor device in the on-state according to the first embodiment of the present invention.

In the semiconductor device according to the first embodiment, the depth D1 of the bottom of the semiconductor region 2a is greater than the depth D0 of the bottom of the base regions 3a and 3b. As illustrated in FIG. 3, the depth D1 of the bottom of the semiconductor region 2a is increased to a spreading level of the depletion layers 40 when no voltage is applied to the drain side. As compared with the semiconductor device of the comparative example illustrated in FIG. 2, the semiconductor device according to the first embodiment can prevent the spread of the depletion layers 40 around the corners of the bottom of the base regions 3a and 3b, so as to increase the current path and decrease the resistance while keeping the breakdown voltage.

In earlier technology, if a voltage of several volts is applied to the drain side in the on-state, the depletion layers spread out to narrow the current path from both sides. However, by the semiconductor device according to the first embodiment, because the semiconductor region 2b having a lower impurity concentration, the concentration is decreased to a level such that the influence on the decrease of breakdown voltage can be minimized, than the semiconductor region 2a is buried more deeply than the semiconductor region 2a, the narrowing of the current path by the depletion layers is protected. Accordingly, the effectiveness of lowering of the on-state resistance is enhanced by the semiconductor device according to the first embodiment.

Next, with reference to FIG. 4A to FIG. 10B, an example of a method of manufacturing the semiconductor device according to the first embodiment will be explained below while referring to a case of fabrication of a MOSFET with a breakdown voltage of 1200 V, for example.

First, a SiC substrate 1 having an impurity concentration of approximately $5 \times 10^{18}$ cm$^{-3}$, being doped with nitrogen, is prepared. The SiC substrate 1 may have a surface orientation of (000-1) plane, with an off-axis angle of about four degrees towards the <11-20> direction.

Figure 4A:
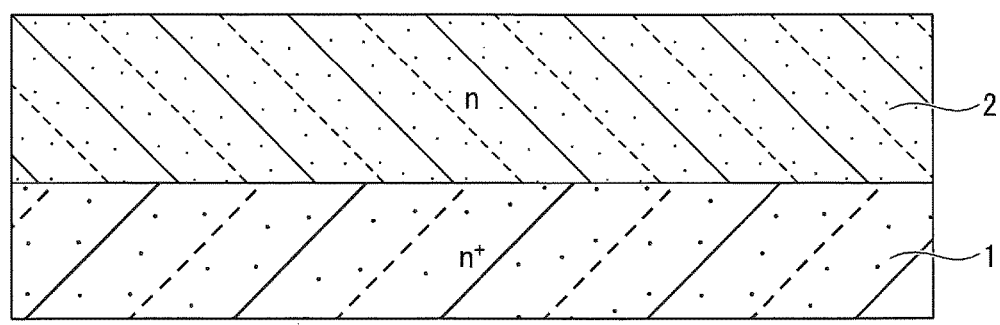
FIGS. 4A and 4B are cross-sectional views illustrating a method of manufacturing the semiconductor device according to the first embodiment of the present invention.

As illustrated in FIG. 4A, the epitaxial layer 2 doped with n-type impurities such as nitrogen is grown on the top surface of the SiC substrate 1. As raw material gas, a Si compound such as monosilane (SiH$_4$) and an organic compound such as methane (CH$_4$), ethane (C$_2$H$_6$), propane (C$_3$H$_8$), butane (C$_4$H$_{10}$), and ethylene (C$_2$H$_4$) are used. As doping gas, nitrogen gas is used. The impurity concentration of the epitaxial layer 2 is approximately $8.0 \times 10^{15}$ cm$^{-3}$, and the thickness of the epitaxial layer 2 is approximately 10 μm, for example.

Figure 4B:
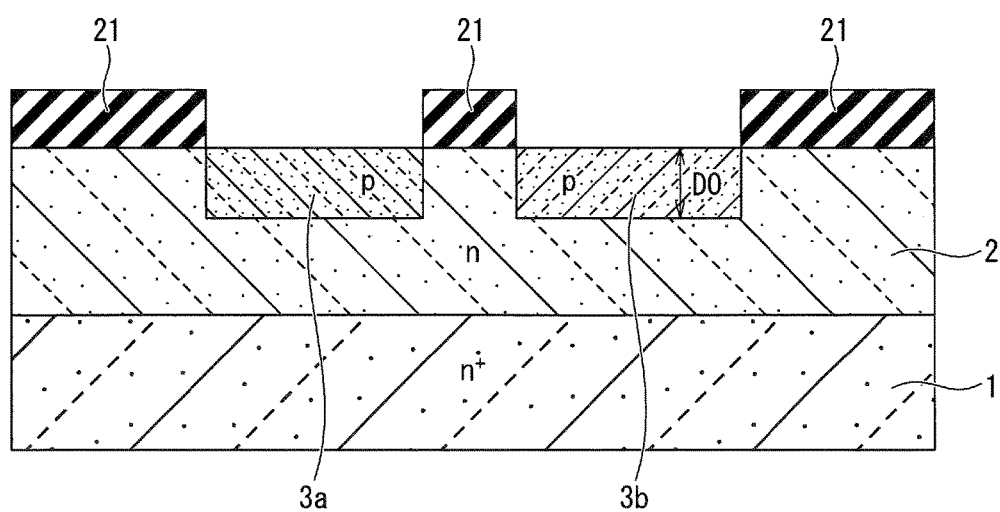

Next, the insulating film 21 such as a silicon oxide film is deposited on the top surface of the epitaxial layer 2 by a low-pressure chemical vapor deposition (LPCVD) method, for example. The insulating film 21 is then delineated by photolithography and etching. Using the delineated insulating film 21 as a mask, the epitaxial layer 2 is subjected to multiple ion-implantations with p-type impurity ions such as Al ions while varying acceleration voltages, so as to selectively form the p-type base regions 3a and 3b on a part of the upper portion of the epitaxial layer 2, as illustrated in FIG. 4B.

The total dose of the impurity ions for the multiple ion-implantations may be determined such that the impurity concentration in the base regions 3a and 3b is set to approximately $3.0 \times 10^{18}$ cm$^{-3}$. The width of the base regions 3a and 3b is approximately 7 μm, and the depth D0 is approximately 0.4 μm, for example. The distance D3 between the adjacent base regions 3a and 3b is approximately 1.5 μm. The insulating film 21 of the oxide film used as a mask is then removed by dry etching, for example.

Figure 5A:
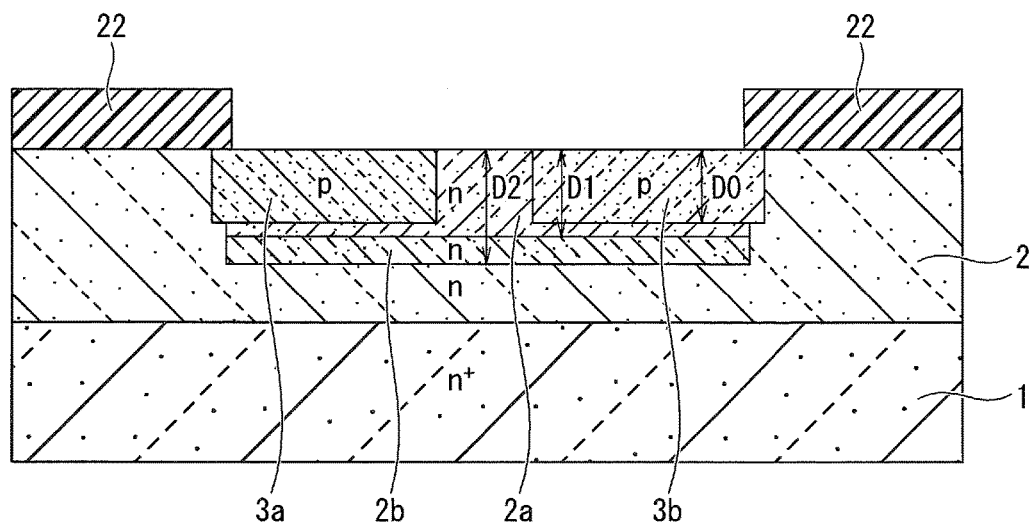
FIGS. 5A and 5B are cross-sectional views, continued from FIG. 4B, illustrating the method of manufacturing the semiconductor device according to the first embodiment of the present invention.

Next, a photoresist film 22 is coated on the top surface of the epitaxial layer 2, and is delineated by photolithography. Using the delineated photoresist film 22 as a mask, the epitaxial layer 2 is subjected to two kinds of multiple ion-implantations sequentially using n-type impurity ions such as nitrogen ions having different total doses, so as to form the n-type semiconductor region 2a and the n-type semiconductor region 2b on a part of the upper portion of the epitaxial layer 2, as illustrated in FIG. 5A. The semiconductor region 2b is formed below and overlaps with the base regions 3a and 3b in the planar pattern such that the bottom of the semiconductor region 2b is located more deeply than the base regions 3a and 3b. The middle of the semiconductor region 2a is surrounded by the base regions 3a and 3b and exposed on the upper portion of the epitaxial layer 2 in the planar pattern. The semiconductor region 2a is formed on the semiconductor region 2b such that the bottom of the semiconductor region 2a is located more deeply than the base regions 3a and 3b.

The respective total doses of the impurity ions for the multiple ion-implantations performed on the semiconductor regions 2a and 2b are determined such that the impurity concentration in the semiconductor region 2b is set to approximately $5.0 \times 10^{16}$ cm$^{-3}$, and the impurity concentration in the semiconductor region 2a is set to approximately $1.0 \times 10^{17}$ cm$^{-3}$, for example. The ion acceleration voltage is determined such that the depth D2 of the bottom of the semiconductor region 2b is set to a deeper projection range than the depth D0 of the bottom of the base regions 3a and 3b, and the depth D1 of the bottom of the semiconductor region 2a is set to a deeper projection range than the depth D0 of the bottom of the base regions 3a and 3b.

The depth D2 of the bottom of the semiconductor region 2b is approximately 0.3 µm greater than the depth D0 of the bottom of the base regions 3a and 3b. The depth D1 of the bottom of the semiconductor region 2a is approximately 0.2 µm greater than the depth D0 of the bottom of the base regions 3a and 3b. For example, the depth D1 of the bottom of the semiconductor region 2a is approximately 0.6 µm, and the depth D2 of the bottom of the semiconductor region 2b is approximately 0.7 µm. The semiconductor region 2a and the semiconductor region 2b may be formed only in the active area 81 as illustrated in FIG. 5A, or may be formed also in the breakdown-voltage-improving area 82. The photoresist film 22 is then removed by wet processing, for example.

Figure 5B:
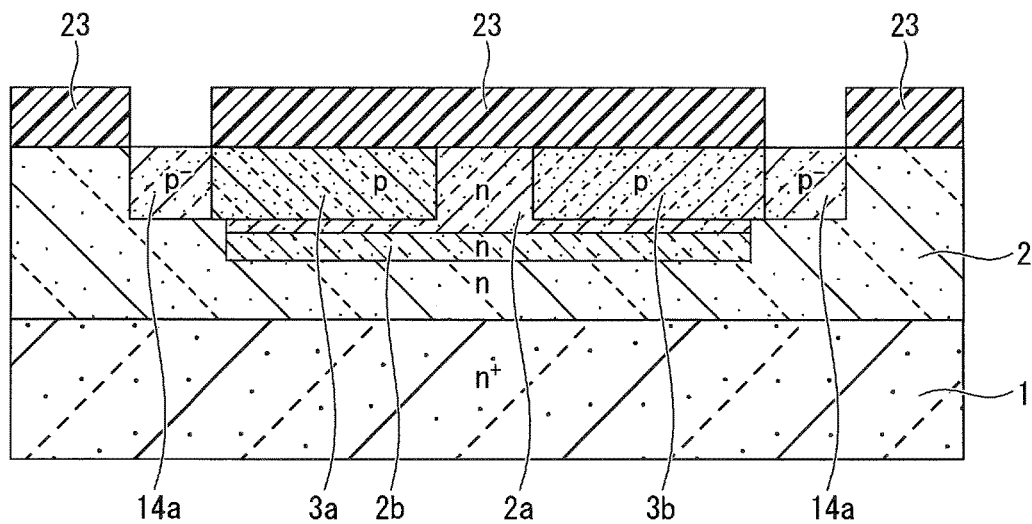

Next, a photoresist film 23 is coated on the top surface of the epitaxial layer 2, and is delineated by photolithography. Using the delineated photoresist film 23 as an implantation mask, the epitaxial layer 2 is subjected to multiple ion-implantations with p-type impurity ions such as Al ions, so as to selectively form the p$^-$-type region 14a at the upper portion of the epitaxial layer 2, as illustrated in FIG. 5B. The total dose of the impurity ions for the multiple ion-implantations may be set to approximately $2.0 \times 10^{13}$ cm$^{-2}$. The photoresist film 23 is then removed by wet processing, for example.

Figure 6A:
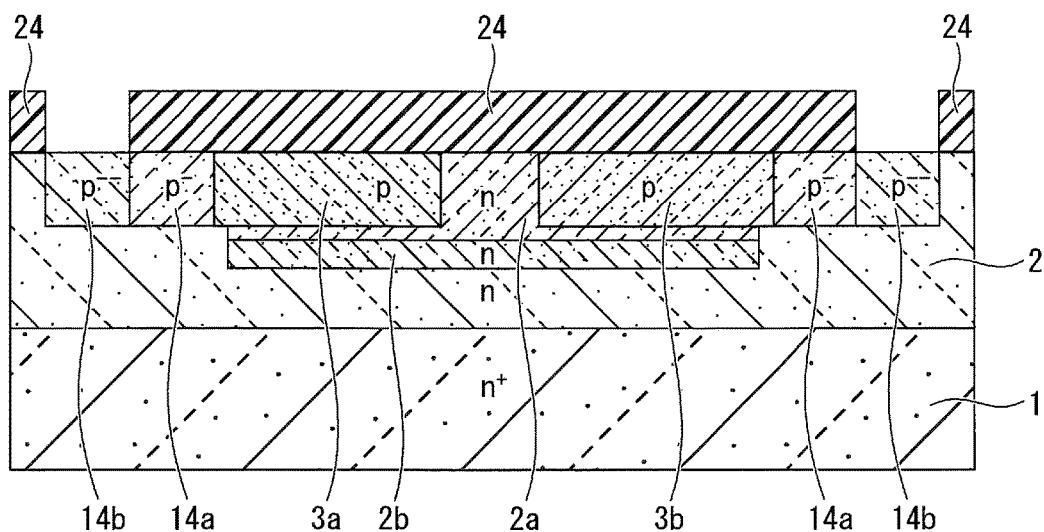
FIGS. 6A and 6B are cross-sectional views, continued from FIG. 5B, illustrating the method of manufacturing the semiconductor device according to the first embodiment of the present invention.

Next, a photoresist film 24 is coated on the top surface of the epitaxial layer 2, and is delineated by photolithography. Using the delineated photoresist film 24 as an implantation mask, the epitaxial layer 2 is subjected to multiple ion-implantations with p-type impurity ions such as Al ions, so as to selectively form the p$^-$-type region 14b at the upper portion of the epitaxial layer 2, as illustrated in FIG. 6A. The total dose of the impurity ions for the multiple ion-implantations may be set to approximately $1.0 \times 10^{13}$ cm$^{-2}$, for example. The photoresist film 24 is then removed by wet processing, for example.

Figure 6B:
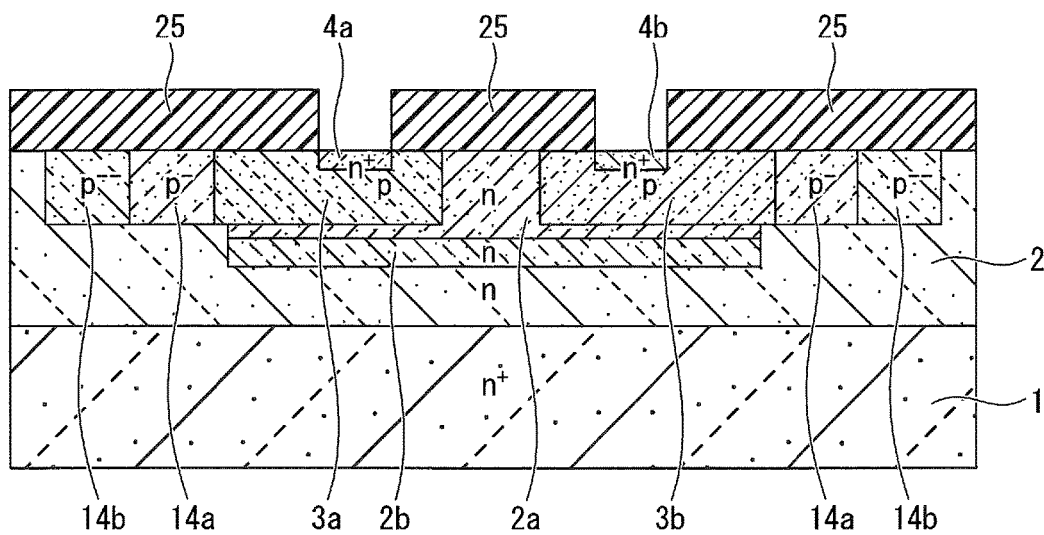

Next, a photoresist film 25 is coated on the top surface of the epitaxial layer 2, and is delineated by photolithography. Using the delineated photoresist film 25 as another implantation mask, the epitaxial layer 2 is further subjected to multiple ion-implantations with n-type impurity ions such as nitrogen ions. The n$^+$-type source regions 4a and 4b are thus selectively formed at the upper portions of the base regions 3a and 3b so as to form a channel between the source regions 4a and 4b and the semiconductor region 2a, as illustrated in FIG. 6B. The photoresist film 25 is then removed by wet processing, for example.

Figure 7A:
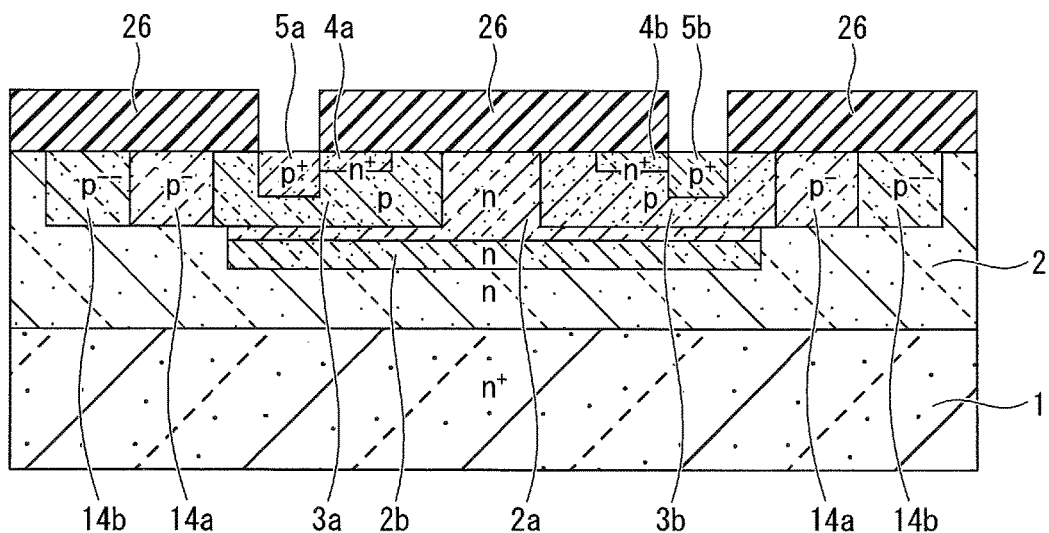
FIGS. 7A and 7B are cross-sectional views, continued from FIG. 6B, illustrating the method of manufacturing the semiconductor device according to the first embodiment of the present invention.

Next, a photoresist film 26 is coated on the top surface of the epitaxial layer 2, and is delineated by photolithography. Using the delineated photoresist film 26 as another implantation mask, the epitaxial layer 2 is still further subjected to multiple ion-implantations with p-type impurity ions such as Al ions, so as to selectively form the p$^+$-type base contact regions 5a and 5b at the upper portions of the base regions 3a and 3b, respectively, as illustrated in FIG. 7A. The base contact regions 5a and 5b are formed in contact with the source regions 4a and 4b, respectively. The photoresist film 26 is then removed by wet processing, for example.

Next, annealing is performed at approximately 1620° C. for approximately three minutes, for example. Accordingly, the ions implanted into the semiconductor region 2a, the semiconductor region 2b, the base regions 3a and 3b, the source regions 4a and 4b, the base contact regions 5a and 5b, the p$^-$-type region 14a, and the p$^-$-type region 14b are activated, and then, the activated impurity may thermally diffuse a slight amount.

The annealing may be independently performed on the base regions 3a and 3b, the source regions 4a and 4b, the base contact regions 5a and 5b, the p$^-$-type region 14a, and the p$^-$-type region 14b after implanting the ions in these regions. The order of preparation is not limited to the base regions 3a and 3b, the source regions 4a and 4b, the base contact regions 5a and 5b, the p$^-$-type region 14a, and the p$^-$-type region 14b, as described above, and may be changed as appropriate.

Figure 7B:
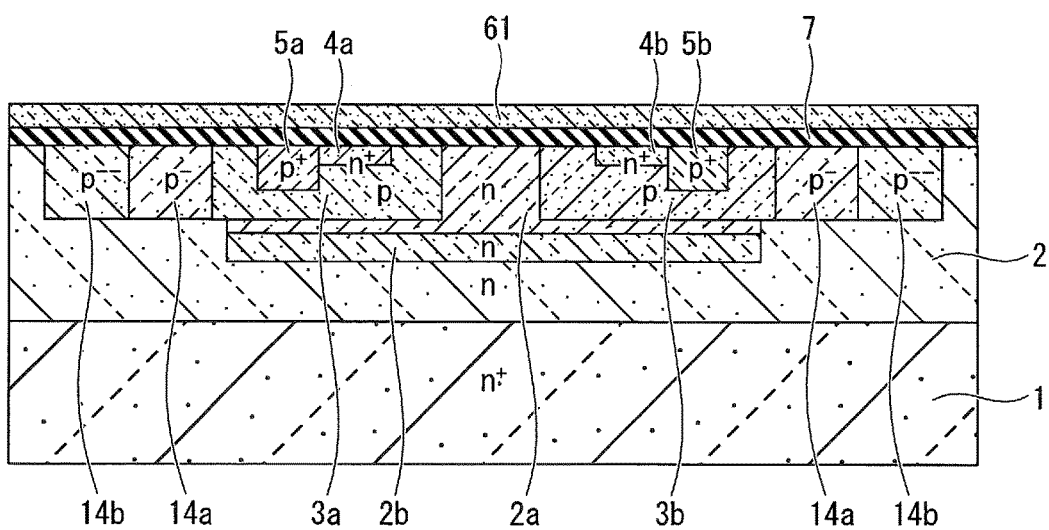

Next, SiC in the respective regions exposed at the top surface of the epitaxial layer 2 is thermally oxidized, so as to form the gate insulating film 7 to a thickness of approximately 100 nm, for example, as illustrated in FIG. 7B. The thermal oxidation of SiC may be performed at 1000° C. in oxygen ambient. Due to the thermal oxidation a part of SiC at the upper portions of the base regions 3a and 3b, the source regions 4a and 4b, the semiconductor region 2a, the p$^-$-type region 14a, the p$^-$-type region 14b, and the epitaxial layer 2 are etched, so that the top surfaces of the base regions 3a and 3b, the source regions 4a and 4b, the semiconductor region 2a, the p$^-$-type region 14a, the p$^-$-type region 14b, and the epitaxial layer 2 are entirely covered with the gate insulating film 7.

Next, a polysilicon layer (doped polysilicon layer) 61 to which n-type impurity atoms such as phosphorus (P) are doped is deposited on the gate insulating film 7 by a CVD method, for example. The polysilicon layer 61 is delineated and selectively removed by photolithography and dry etching. As a result, a part of the polysilicon layer 61 remains on the base regions 3a and 3b located between the source regions 4a and 4b and the semiconductor region 2a, so as to form the gate electrode 6 for controlling the surface potentials of the channels, as illustrated in FIG. 8A.

Figure 8A:
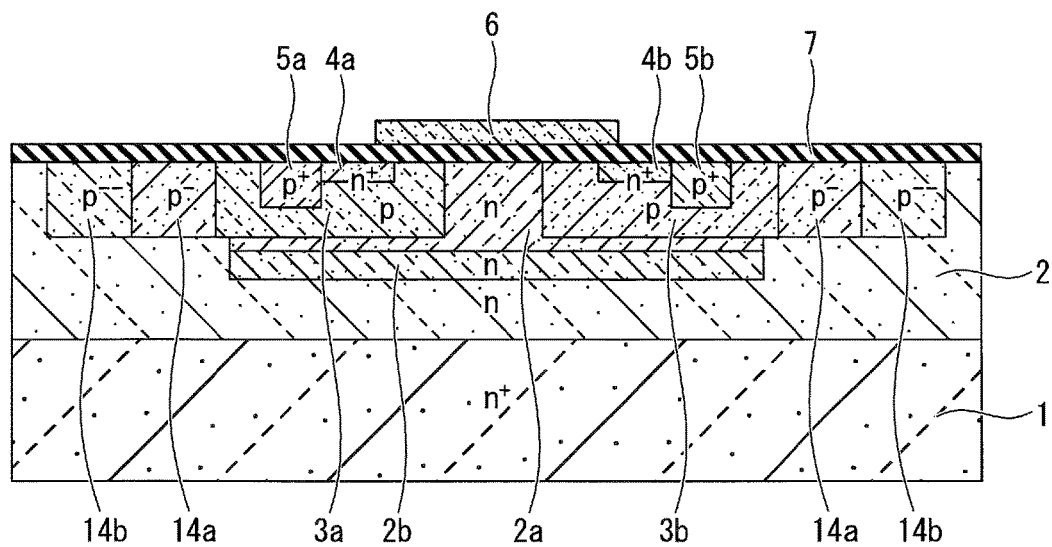
FIGS. 8A and 8B are cross-sectional views, continued from FIG. 7B, illustrating the method of manufacturing the semiconductor device according to the first embodiment of the present invention.

Although the gate electrode 6 is delineated to cover the semiconductor region 2a, as illustrated in FIG. 8A, the gate electrode 6 may be selectively arranged only on the base regions 3a and 3b interposed between the source regions 4a and 4b and the semiconductor region 2a.

Figure 8B:
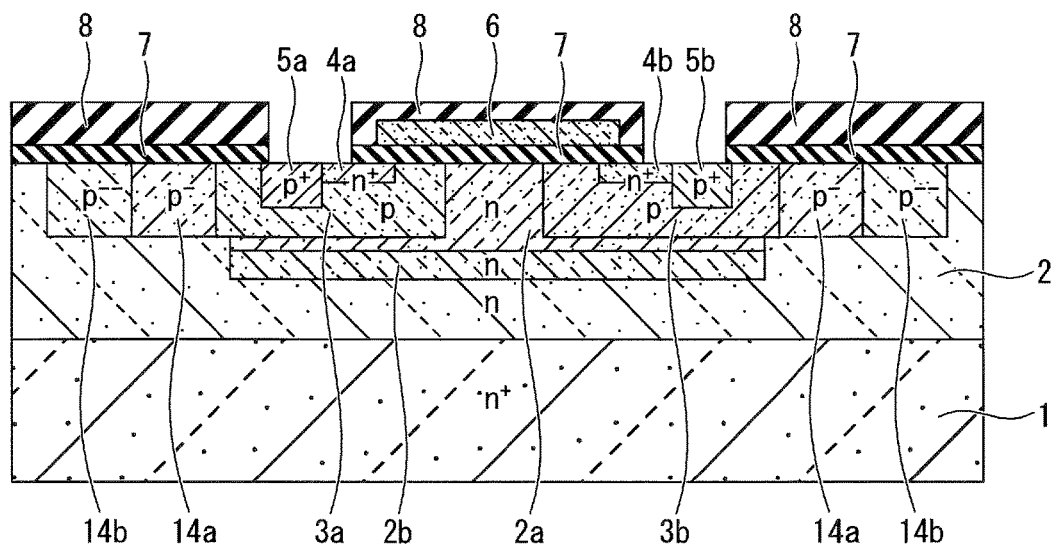

Next, the interlayer insulating film 8, such as phosphor silicate glass (PSG), is deposited to a thickness of 1 µm to cover the exposed portions of the gate electrode 6 and the gate insulating film 7. Subsequently, the interlayer insulating film 8 and the gate insulating film 7 are delineated and selectively removed by photolithography and dry etching. As a result, the contact holes are open on which the source regions 4a and 4b and the base contact regions 5a and 5b are exposed, as illustrated in FIG. 8B. Thereafter, annealing (reflow) is performed to flatten the interlayer insulating film 8.

Figure 9A:
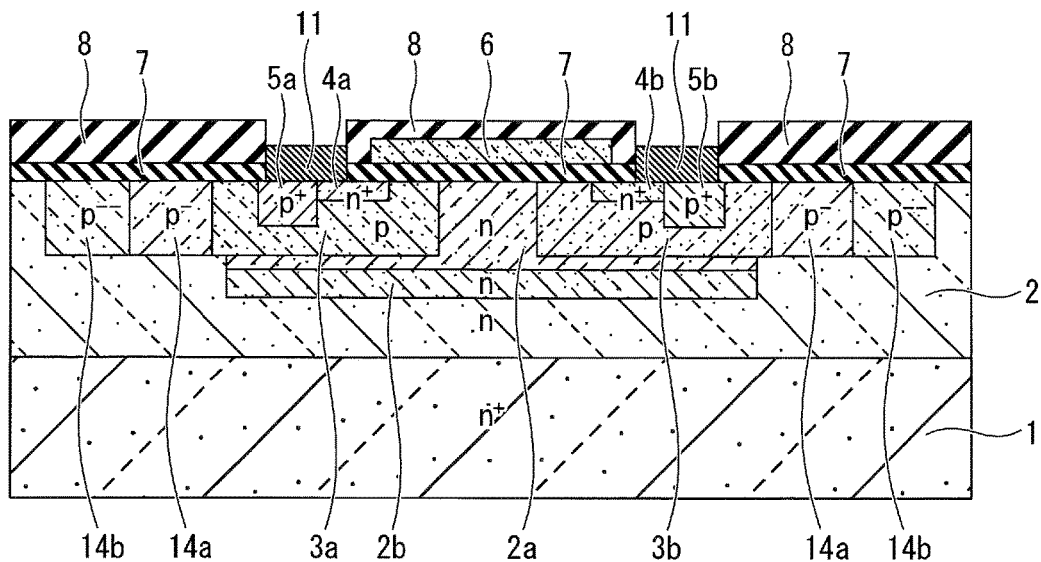
FIGS. 9A and 9B are cross-sectional views, continued from FIG. 8B, illustrating the method of manufacturing the semiconductor device according to the first embodiment of the present invention.

Next, a metallic film is laminated on the entire surface including the top surface of the interlayer insulating film 8 by sputtering or vacuum evaporation. Subsequently, the source electrode 11 is delineated by photolithography and dry etching so that the metallic film is selectively removed in the breakdown-voltage-improving area 82 and the active area 81, excluding the film deposited on the contact holes in the active area 81. As a result, the source electrode 11 is formed in contact with the source regions 4a and 4b and the base contact regions 5a and 5b, as illustrated in FIG. 9A.

Figure 9B:
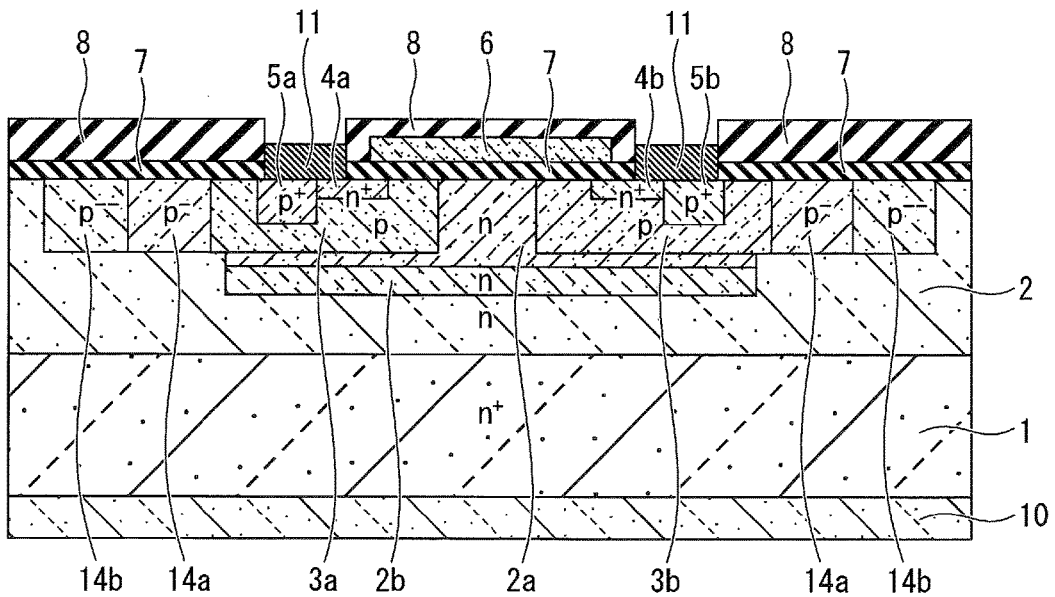

Next, the backside electrode 10 made of nickel (Ni), for example, is deposited on the bottom surface of the SiC substrate 1 by sputtering or vacuum evaporation, as illustrated in FIG. 9B. Subsequently, annealing is performed at 970° C., for example, so as to obtain an ohmic contact between the SiC substrate 1 and the backside electrode 10.

Figure 10A:
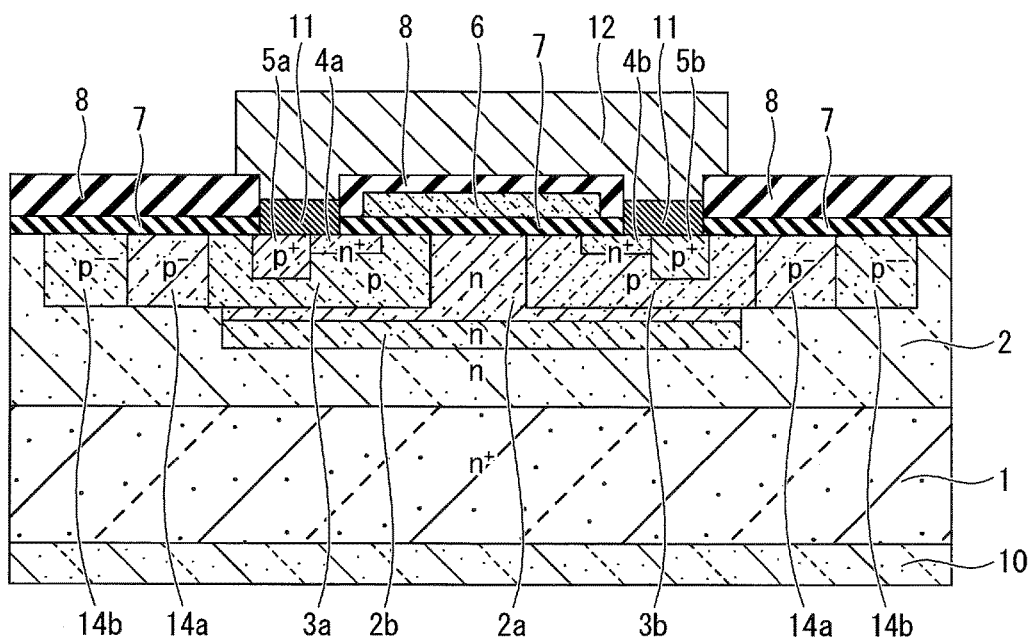
FIGS. 10A and 10B are cross-sectional views, continued from FIG. 9B, illustrating the method of manufacturing the semiconductor device according to the first embodiment of the present invention.

Next, a metallic film such as aluminum (Al) is laminated above the entire top surface of the epitaxial layer 2 by sputtering or vacuum evaporation to cover the source electrode 11 and the interlayer insulating film 8 in the active area 81. The thickness of the metallic film laminated at a position corresponding to the interlayer insulating film 8 may be approximately 5 μm. Subsequently, the electrode pad 12 is delineated by photolithography and dry etching so that a part of the metallic film is selectively removed. As a result, the electrode pad 12 is formed in contact with the source electrode 11, as illustrated in FIG. 10A.

Figure 10B:
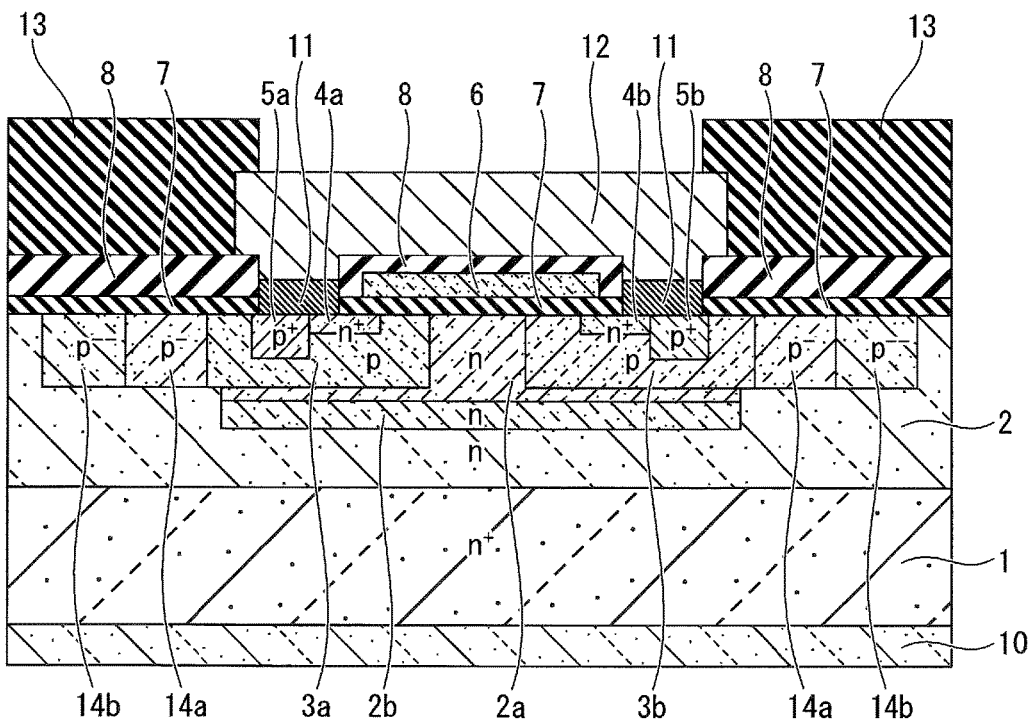

Next, an insulating film is deposited above the entire top surface of the epitaxial layer 2. Subsequently, the protection film 13 is delineated by photolithography and dry etching so that part of the insulating film is selectively removed. As a result, the protection film 13 is formed to cover the endmost portion of the electrode pad 12 toward the breakdown-voltage-improving area 82, as illustrated in FIG. 10B.

Thereafter, as necessary, titanium, nickel, and gold (Au) are sequentially laminated on the bottom surface of the backside electrode 10 by sputtering or vacuum evaporation, so as to form a backside electrode pad 15. Accordingly, the MOSFET illustrated in FIG. 1 is completed. The backside electrode pad 15 may be formed by connecting a metallic plate, or metallic plates such as molybdenum (Mo) and tungsten (W) by alloying process.

By the method of manufacturing the semiconductor device according to the first embodiment, the semiconductor device having a minimized on-state resistance can be achieved, while suppressing the lowering of the breakdown voltage.

Second Embodiment

Figure 11:
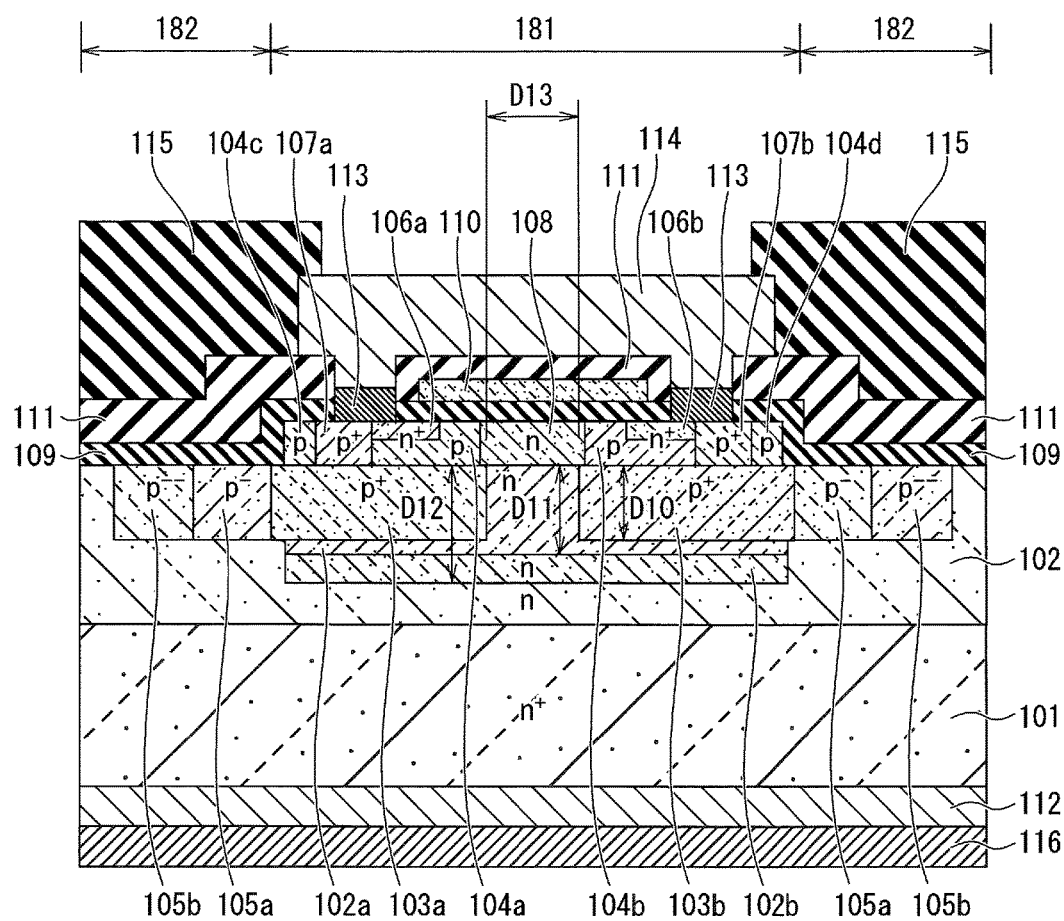
FIG. 11 is a cross-sectional view illustrating a structure of a semiconductor device according to a second embodiment of the present invention.

As illustrated in FIG. 11, a semiconductor device according to a second embodiment of the present invention includes an active area 181, and a breakdown-voltage-improving area 182 provided on the circumference of the active area 81. The semiconductor device according to the second embodiment basically includes an n⁺-type semiconductor substrate 101, and an n-type epitaxial layer 102 provided on the top surface of the semiconductor substrate 101.

Similar to the case of the first embodiment, the semiconductor substrate 101 and the epitaxial layer 102 are each made of a semiconductor material having a wide band gap of greater than 2.0 eV at room temperature. The second embodiment exemplifies the case in which the semiconductor substrate 101 and the epitaxial layer 102 are made of SiC.

The semiconductor substrate 101 serves as a drain region. A backside electrode (drain electrode) 112 is laminated on the bottom surface of the semiconductor substrate 101. The thickness of the epitaxial layer 102 serving as a drift region is approximately 10 μm, for example.

A MOS structure (element structure) is arranged on the top surface side of the epitaxial layer 102. An n-type semiconductor region (first semiconductor region) 102b having a higher impurity concentration than the epitaxial layer 102, is selectively buried in a part of the upper portion of the epitaxial layer 102. An n-type semiconductor region (second semiconductor region) 102a having a higher impurity concentration than the semiconductor region 102b, is stacked on the semiconductor region 102b. The semiconductor region 102a overlaps with the semiconductor region 102b in the planar pattern such that the bottom surface of the semiconductor region 102a is in contact with the semiconductor region 102b.

Although FIG. 11 illustrates the case in which the respective semiconductor regions 102a and 102b are provided only in the active area 81, the semiconductor regions 102a and 102b may further extend into the breakdown-voltage-improving area 82.

In the upper portion of the semiconductor region 102a, p⁺-type first base layers 103a and 103b are selectively buried. Because the semiconductor region 102a has a central vertical portion protruding perpendicularly from a lower-laying flat portion so as to implement a topology of an inverted T shape in a cross-sectional view, the first base layers 103a and the first base layers 103b sandwich the central protruding portion of the semiconductor region 102a, such that the bottoms of the first base layers 103a and 103b are in contact with the upper surface of the lower-laying flat portion of the semiconductor region 102a.

The width of the respective first base layers 103a and 103b is approximately 13 and the depth of the respective first base layers 103a and 103b is approximately 0.4 μm, for example. The distance D13 between the adjacent first base layers 103a and 103b is approximately 1.2 μm, for example.

The depth D11 of the bottom of the semiconductor region 102a and the depth D12 of the bottom of the semiconductor region 102b measured from the top surface of the epitaxial layer 102, as defined in FIG. 11, are greater than the depth D10 of the bottom of the first base layers 103a and 103b.

The depth D11 of the bottom of the semiconductor region 102a is approximately 0.6 μm, for example. The depth D11 of the bottom of the semiconductor region 102a is preferably at least 0.15 μm greater than the depth D10 of the first base layers 103a and 103b.

The semiconductor region 102a having the bottom depth D11 at least 0.15 μm greater than the bottom depth D10 of the first base layers 103a and 103b can decrease spreading resistance from JFET, so as to effectively decrease the on-state resistance while keeping the breakdown voltage.

The depth D12 of the bottom of the semiconductor region 102b is approximately 0.7 μm, for example. The depth D12 of the bottom of the semiconductor region 102b is preferably at least 0.3 μm greater than the depth D10 of the first base layers 103a and 103b. The semiconductor region 102b having the bottom depth D12 at least 0.3 μm greater than the bottom depth D10 of the first base layers 103a and 103b can decrease spreading resistance from JFET, so as to effectively decrease the on-state resistance while keeping the breakdown voltage.

When the impurity concentration of the semiconductor region 102a is defined as $N_{d1}$ cm⁻³, and the impurity concentration of the semiconductor region 102b is defined as $N_{d2}$ cm⁻³, the depth D11 of the bottom of the semiconductor region 102a is preferably at least $5.5 \times 10^3 N_{d1}^{0.5}$ μm greater than the depth D10 of the bottom of the first base layers 103a and 103b. The semiconductor region 102a having the bottom depth D11 at least $5.5 \times 10^3 /N_{d1}^{0.5}$ μm greater than the bottom depth D10 of the first base layers 103a and 103b can prevent depletion of JFET, so as to effectively decrease the on-state resistance while keeping the breakdown voltage.

The depth D12 of the bottom of the semiconductor region 102b is preferably at least $6.5 \times 10^3 N_{d2}^{0.5}$ μm greater than the depth D10 of the bottom of the first base layers 103a and 103b. The semiconductor region 102b having the bottom depth D12 at least $6.5 \times 10^3 /N_{d2}^{0.5}$ μm greater than the bottom depth D10 of the first base layers 103a and 103b can prevent depletion of JFET, so as to effectively decrease the on-state resistance while keeping the breakdown voltage.

On the top surfaces of the first base layers 103a and 103b, p-type second base layers 104a and 104b made of SiC are stacked, so that p-type second base layers 104a and 104b can contact with the first base layers 103a and 103b, respectively. The impurity concentration of the second base layers 104a and 104b is lower than that of the first base layers 103a and 103b. According to the second embodiment, the first base layers 103a and 103b and the second base layers 104a and 104b are included in a base region.

N$^+$-type source regions 106a and 106b are selectively buried in the upper portions of the second base layers 104a and 104b to define channels at the surface layers of the second base layers 104a and 104b. Further, p$^+$-type base contact regions 107a and 107b having a higher impurity concentration than the second base layers 104a and 104b are selectively buried in the second base layers 104a and 104b, being contact with the second base layers 104a and 104b and the source regions 106a and 106b. The base contact regions 107a and 107b are located closer to the breakdown-voltage-improving area 182 than the source regions 106a and 106b. Further, p-type regions 104c and 104d are buried in the breakdown-voltage-improving area 182 side of the base contact regions 107a and 107b.

An n-type well region 108 is interposed between the adjacent second base layers 104a and 104b and in contact with the top surface of the semiconductor region 102a. The impurity concentration of the well region 108 is higher than the impurity concentration of the semiconductor region 102a, for example. The impurity concentration of the well region 108 may be lower than or the same as the impurity concentration of the semiconductor region 102a. The well region 108 serves as a drift region together with the epitaxial layer 102, the semiconductor region 102a, and the semiconductor region 102b. The width of the well region 108 is approximately 1.4 μm, and the thickness of the well region 108 is approximately 0.5 μm, for example.

On the top surfaces of the channels in the second base layers 104a and 104b defined between the source regions 106a and 106b and the well region 108, a gate insulating film 109 is laminated, and a gate electrode 110 is disposed on the gate insulating film 109 to control a surface potentials of the channels between the second base layers 104a and 104b and the source regions 106a and 106b. As illustrated in FIG. 11, the gate electrode 110 may be provided also on the surface of the well region 108 via the gate insulating film 109.

Although FIG. 11 exemplifies only a single MOS structure in the active area 181, a plurality of MOS structures may be arranged in parallel in the active area 181.

An interlayer insulating film 111 is provided to cover the gate electrode 110 and other regions. A source electrode 113 is arranged in contact with the source regions 106a and 106b and the base contact regions 107a and 107b via contact holes cut in the interlayer insulating film 111, the base contact regions 107a and 107b further penetrate the gate insulating film 109. The source electrode 113 is electrically insulated from the gate electrode 110 by the interlayer insulating film 111.

An electrode pad 114 is stacked on the source electrode 113, being electrically connected to the source electrode 113. The periphery of the planar pattern of the electrode pad 114 terminates at the edge portion of the breakdown-voltage-improving area 182. A protection film (passivation film) 115 having a function to prevent discharge is laminated above the breakdown-voltage-improving area 182, covering the endmost portion of the electrode pad 114 toward the breakdown-voltage-improving area 182. The protection film 115 used may be a silicon oxide film or an insulating film such as polyimide.

In the breakdown-voltage-improving area 182, an annular p$^-$-type region 105a and an annular p$^-$-type region 105b are buried in the upper portion of the epitaxial layer 102. The p$^-$-type region 105a and the p$^-$-type region 105b implement a double-zone JTE structure. By the interlayer insulating film 111, the top surface of the JTE structure is electrically insulated from a surface-interconnection structure for the active area 181.

The p$^-$-type region 105a is buried in the first base layers 103a and 103b, being contact with the periphery of the first base layers 103a and 103b to surround the first base layers 103a and 103b. The annular p$^-$-type region 105b is in contact with the periphery of the p$^-$-type region 105a to surround the annular p$^-$-type region 105a. Namely, the peripheries of the p$^-$-type region 105a and the p$^-$-type region 105b are sequentially arranged in concentrically parallel along the radial direction from the active area 181 to the breakdown-voltage-improving area 182 to surround the first base layers 103a and 103b in the planar pattern. The impurity concentration of the p$^-$-type region 105a is lower than that of the first base layers 103a and 103b. The impurity concentration of the p$^-$-type region 105b is lower than that of the p$^-$-type region 105a.

When a positive voltage is applied between the gate and the source, inversion-channel layers are formed on the surface layers of the channels defined in the second base layers 104a and 104b immediately below the gate electrode 110, and then the semiconductor device according to the second embodiment becomes the on-state. At the same time, a current path is formed in which a current flows through the source electrode 113, the base contact region 107a, the source region 106a, the inversion-channel layer in the surface layer of the second base region 104a, the well region 108, the semiconductor region 102a, the semiconductor region 102b, the epitaxial layer 102, the semiconductor substrate 101, and the drain electrode 112. In addition, a current path is formed in which a current flows through the source electrode 113, the base contact region 107b, the source region 106b, the inversion-channel layer in the surface layer of the second base region 104b, the well region 108, the semiconductor region 102a, the semiconductor region 102b, the epitaxial layer 102, the semiconductor substrate 101, and the drain electrode 112. Accordingly, the current flows from the drain electrode 112 toward the source electrode 113.

In the semiconductor device according to the second embodiment, the depth D11 of the bottom of the semiconductor region 102a is greater than the depth D10 of the first base layers 103a and 103b, and is increased to a spreading level of the depletion layer when no voltage is applied to the drain side, as in the case of the semiconductor device according to the first embodiment. Accordingly, the resistance can be decreased while the breakdown voltage is maintained.

In earlier technology, if a voltage of several volts is applied to the drain side in the on-state, the depletion layers spread out to narrow the current path from both sides. However, by the semiconductor device according to the second embodiment, because the semiconductor region 102b having a lower impurity concentration, the concentration is decreased to a level such that the influence on the decrease of breakdown voltage can be minimized, than the semiconductor region 102a is buried more deeply than the semiconductor region 102a, the narrowing of the current path by the depletion layers is protected. Accordingly, the effectiveness of lowering of the on-state resistance is enhanced by the semiconductor device according to the second embodiment.

Next, with reference to FIG. 12A to FIG. 16, an example of a method of manufacturing the semiconductor device according to the second embodiment will be explained below, referring to a case of fabrication of a MOSFET with a breakdown voltage of 1200 V, for example.

First, a SiC substrate 101 having an impurity concentration of approximately $5\times10^{18}$ cm$^{-3}$, being doped with nitrogen, is prepared. The SiC substrate 101 may have a surface orientation of (000-1) plane, with an off-axis angle of about four degrees towards the <11-20> direction.

Figure 12A:
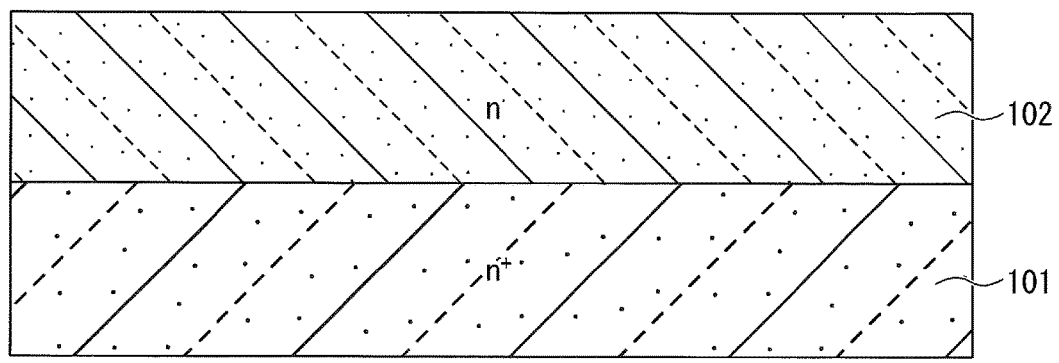
FIGS. 12A and 12B are cross-sectional views illustrating a method of manufacturing the semiconductor device according to the second embodiment of the present invention.

As illustrated in FIG. 12A, the epitaxial layer 102 of n-type SiC is grown on the (000-1) plane of the SiC substrate 101. As raw material gas, a Si compound such as SiH$_4$ and an organic compound such as CH$_4$, C$_2$H$_6$, C$_3$H$_8$, C$_4$H$_{10}$, and C$_2$H$_4$ are used. As doping gas, nitrogen gas is used. The impurity concentration of the epitaxial layer 102 is approximately $8.0\times10^{15}$ cm$^{-3}$, and the thickness of the epitaxial layer 102 is approximately 10 µm, for example.

Figure 12B:
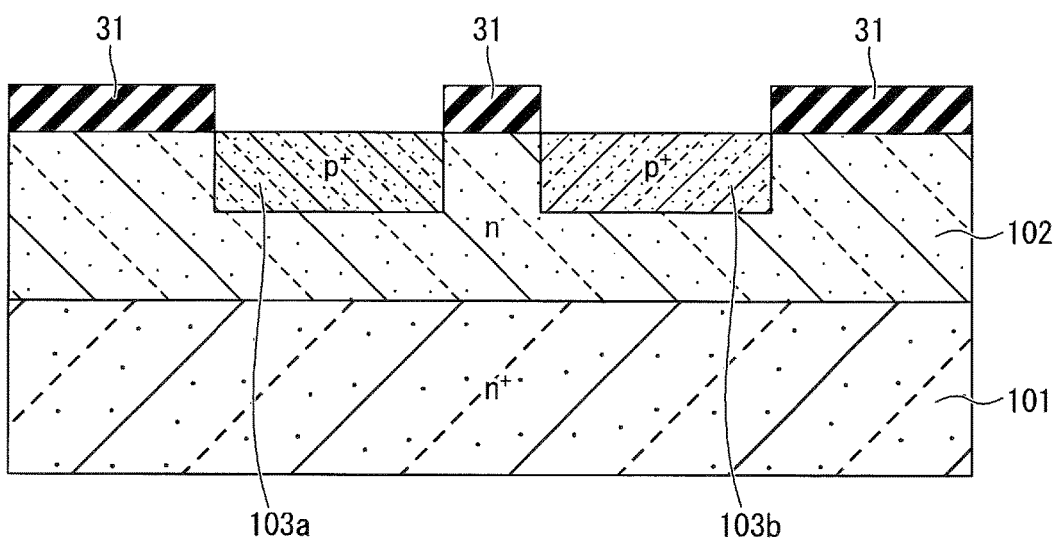

Next, the insulating film 31 such as a SiO$_2$ film is deposited on the top surface of the epitaxial layer 102 by a CVD method, for example. The insulating film 31 is then delineated by photolithography and etching. By using the delineated insulating film 31 as an implantation mask, the epitaxial layer 102 is subjected to multiple ion-implantations with p-type impurity ions such as Al ions, while varying acceleration voltages, so as to selectively form the p$^+$-type first base layers 103a and 103b on a part of the upper portion of the epitaxial layer 102, as illustrated in FIG. 12B.

The total dose of the impurity ions for the multiple ion-implantations is determined such that the impurity concentration in the first base layers 103a and 103b is set to approximately $3.0\times10^{18}$ cm$^{-3}$. The width of the first base layers 103a and 103b is approximately 13 and the depth of the first base layers 103a and 103b is approximately 0.4 µm, for example. The distance D13 between the adjacent first base layers 103a and 103b may be approximately 1.2 µm. The insulating film 31 is then removed.

Figure 13A:
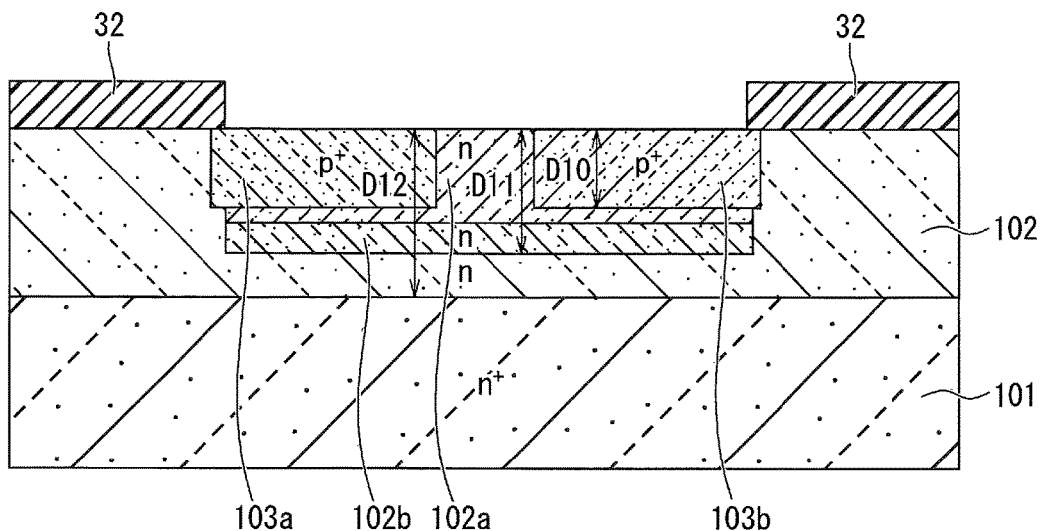
FIGS. 13A and 13B are cross-sectional views, continued from FIG. 12B, illustrating the method of manufacturing the semiconductor device according to the second embodiment of the present invention.

Next, a photoresist film 32 is coated on the top surface of the epitaxial layer 102, and is delineated by photolithography. Using the delineated photoresist film 32 as another implantation mask, the epitaxial layer 102 is further subjected to two kinds of multiple ion-implantations having different total doses sequentially using n-type impurity ions such as nitrogen ions. The semiconductor region 102a and the semiconductor region 102b are thus formed at the upper portion of the epitaxial layer 102 such that the bottom of the semiconductor regions 102a and 102b are greater than the thickness of the first base layers 103a and 103b, as illustrated in FIG. 13A. The semiconductor region 102b is formed adjacent to the first base layers 103a and 103b and is partly exposed on the upper portion of the epitaxial layer 102. The semiconductor region 102a is formed on and overlaps with the semiconductor region 102b while being surrounded by the first base layers 103a and 103b in a planar pattern.

The respective total doses of the impurity ions for the multiple ion-implantations performed on the semiconductor regions 102a and 102b may be determined such that the impurity concentration in the semiconductor region 102a is set to approximately $1.0\times10^{17}$ cm$^{-3}$, and the impurity concentration in the semiconductor region 102b is set to approximately $5.0\times10^{16}$ cm$^{-3}$. The ion acceleration voltage may be determined such that the depth D11 of the bottom of the semiconductor region 102a and the depth D12 of the bottom of the semiconductor region 102b are each set to a deeper projection range than the depth D10 of the bottom of the first base layers 103a and 103b. The depth D11 of the bottom of the semiconductor region 102a is approximately 0.6 which is approximately 0.2 µm greater than the depth D10 of the bottom of the first base layers 103a and 103b. The depth D12 of the bottom of the semiconductor region 102b is approximately 0.7 which is approximately 0.3 µm greater than the depth D10 of the bottom of the first base layers 103a and 103b.

Although the semiconductor region 102a and the semiconductor region 102b implementing the active area 181 are illustrated in FIG. 13A, the semiconductor region 102a and the semiconductor region 102b may further extend to the breakdown-voltage-improving area 182. The photoresist film 32 is then removed by wet processing, for example.

Figure 13B:
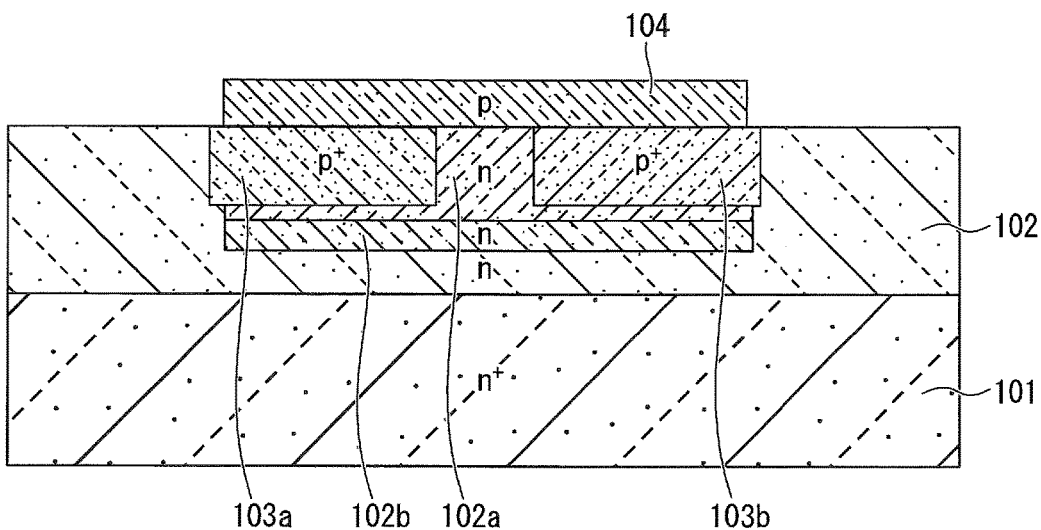

Next, an epitaxial layer 104 made of p-type SiC doped with Al is grown on the top surface of the epitaxial layer 102. As raw material gas, a Si compound such as SiH$_4$ and an organic compound such as CH$_4$, C$_2$H$_6$, C$_3$H$_8$, C$_4$H$_{10}$, and C$_2$H$_4$ are used. As doping gas, trimethylaluminum ((CH$_3$)$_3$Al) is used. The impurity concentration of the epitaxial layer 104 is approximately $5.0\times10^{15}$ cm$^{-3}$, and the thickness of the epitaxial layer 104 is approximately 0.5 µm, for example. Subsequently, the epitaxial layer 104 in the breakdown-voltage-improving area 182 is selectively removed with a depth of approximately 0.7 µm by photolithography and etching, as illustrated in FIG. 13B. As a result, the epitaxial layer 102 is exposed in the breakdown-voltage-improving area 182.

Figure 14A:
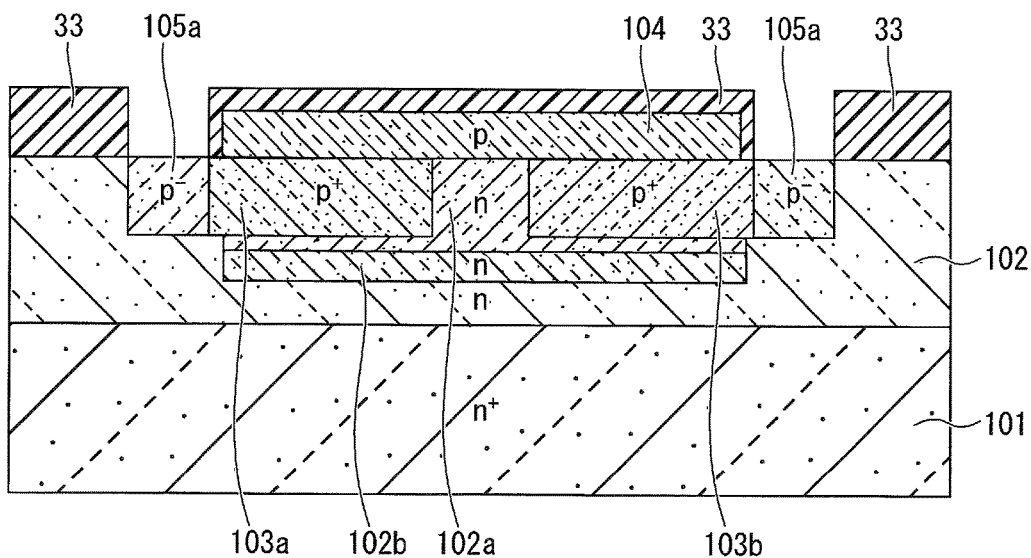
FIGS. 14A and 14B are cross-sectional views, continued from FIG. 13B, illustrating the method of manufacturing the semiconductor device according to the second embodiment of the present invention.

Next, a photoresist film 33 is coated on the top surface of the epitaxial layer 104, and is delineated by photolithography. Using the delineated photoresist film 33 as another implantation mask, the epitaxial layer 102 is still further subjected to multiple ion-implantations with p-type impurity ions such as Al ions, so as to selectively form the p$^-$-type region 105a at the upper portion of the epitaxial layer 102, as illustrated in FIG. 14A. The total dose of the impurity ions for the multiple ion-implantations may be set to approximately $2.0\times10^{13}$ cm$^{-2}$, for example. The photoresist film 33 is then removed by wet processing, for example.

Figure 14B:
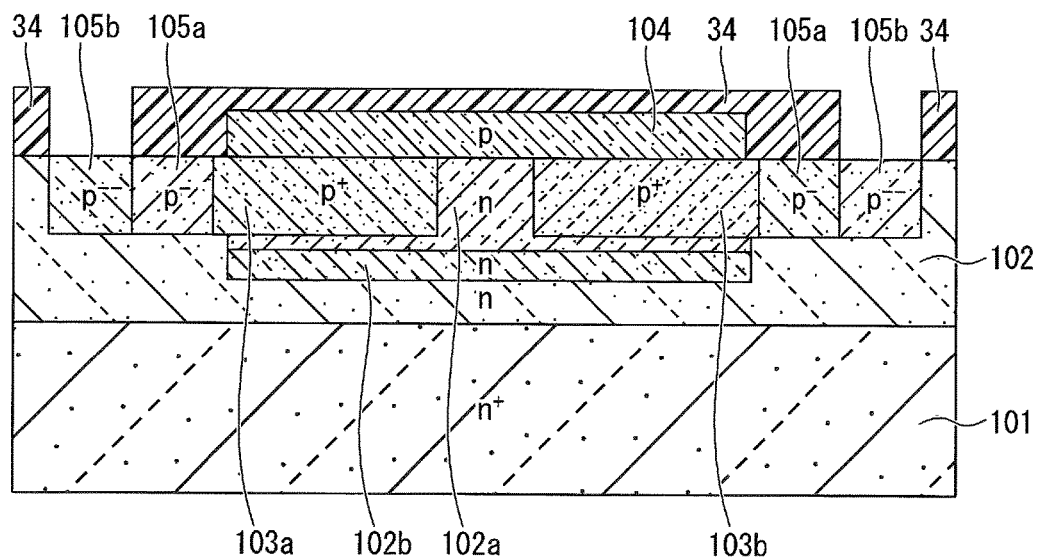

Next, a photoresist film 34 is coated on the top surface of the epitaxial layer 104, and is delineated by photolithography. Using the delineated photoresist film 34 as another implantation mask, the epitaxial layer 102 is still further subjected to multiple ion-implantations with p-type impurity ions such as Al ions, so as to selectively form the p$^-$-type region 105b at the upper portion of the epitaxial layer 102, as illustrated in FIG. 14B. The total dose of the impurity ions for the multiple ion-implantations is set to approximately $1.0\times10^{13}$ cm$^{-2}$, for example. The photoresist film 34 is then removed by wet processing, for example.

Figure 15A:
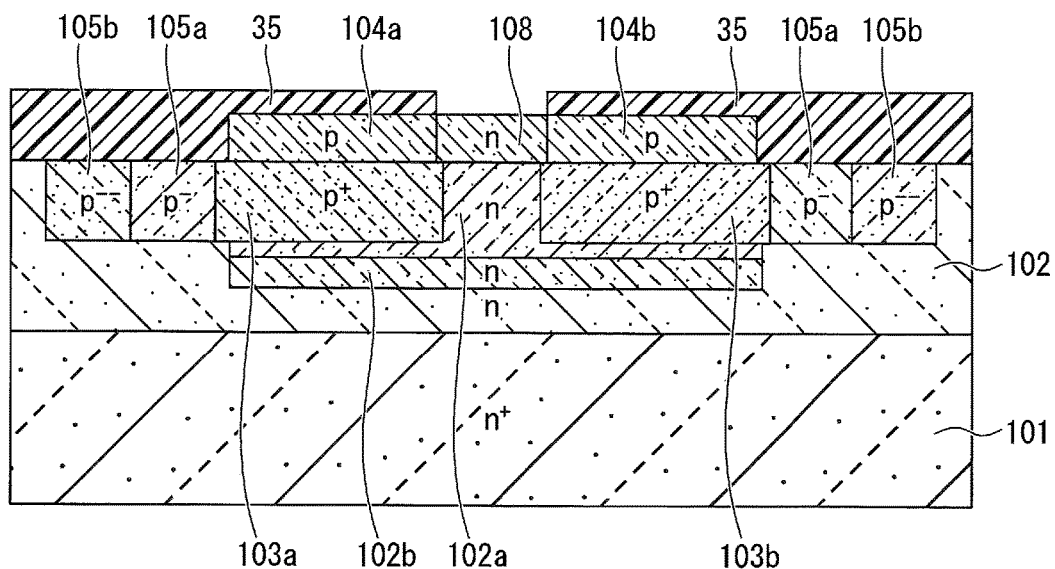
FIGS. 15A and 15B are cross-sectional views, continued from FIG. 14B, illustrating the method of manufacturing the semiconductor device according to the second embodiment of the present invention.

Next, a photoresist film 35 is coated on the top surface of the epitaxial layer 104, and is delineated by photolithography. Using the delineated photoresist film 35 as another implantation mask, the epitaxial layer 102 is still further subjected to multiple ion-implantations with n-type impurity ions such as nitrogen ions, so as to invert the conductivity type of part of the epitaxial layer 104 to selectively form the n-type well region 108, as illustrated in FIG. 15A.

The total dose of the impurity ions for the multiple ion-implantations may be determined such that the impurity concentration in the well region 108 is set to approximately $3.0\times10^{16}$ cm$^{-3}$. The multiple ion-implantations may be performed in nine steps, and the acceleration energy and the doping concentration in the nine steps may be at 600 keV and $5.5\times10^{11}$/cm$^2$, at 460 keV and $3.7\times10^{11}$/cm$^2$, at 360 keV and $2.7\times10^{11}$/cm$^2$, at 300 keV and $2.2\times10^{11}$/cm$^2$, at 240 keV and $2.7\times10^{11}$/cm$^2$, at 180 keV and $2.5\times10^{11}$/cm$^2$, at 130 keV and $3\times10^{11}$/cm$^2$, at 80 keV and $2.5\times10^{11}$/cm$^2$, and at 40 keV and $2\times10^{11}$/cm$^2$. The width and the depth of the well region 108 may be 1.4 µm and 0.5 µm. The well region 108 divides the epitaxial layer 104 so as to provide the p-type second base layers 104a and 104b on both sides. The photoresist film 35 is then removed by wet processing, for example.

Figure 15B:
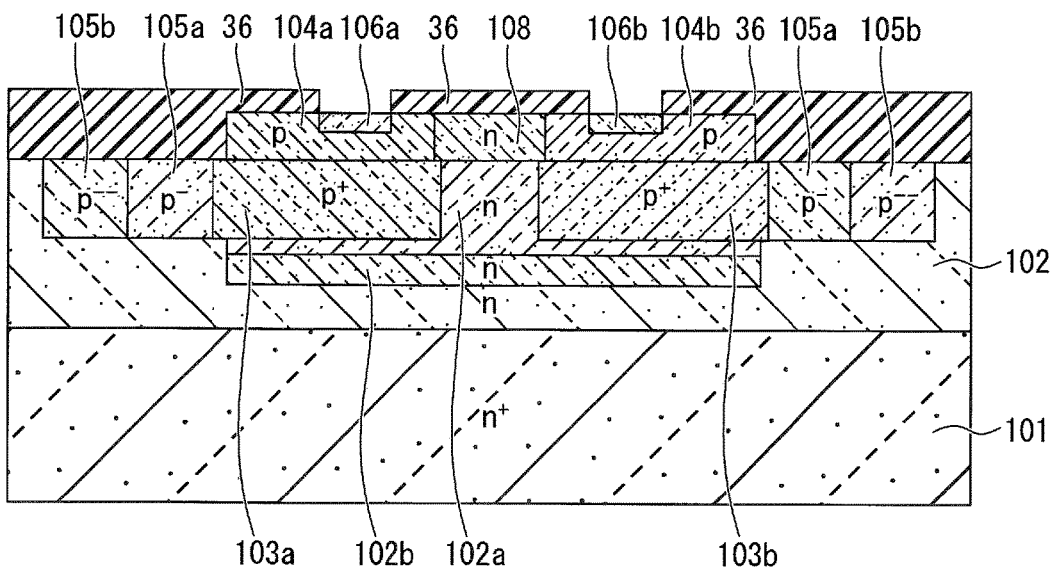

Next, a photoresist film 36 is coated on the top surface of the well region 108 and the second base layers 104a and 104b, and is delineated by photolithography. Using the delineated photoresist film 36 as another implantation mask, the epitaxial layer 102 is still further subjected to ion implantation with n-type impurity ions such as nitrogen ions, so as to selectively form the n$^+$-type source regions 106a and 106b at the upper portions of the second base layers 104a and 104b, as illustrated in FIG. 15B.

Figure 16:
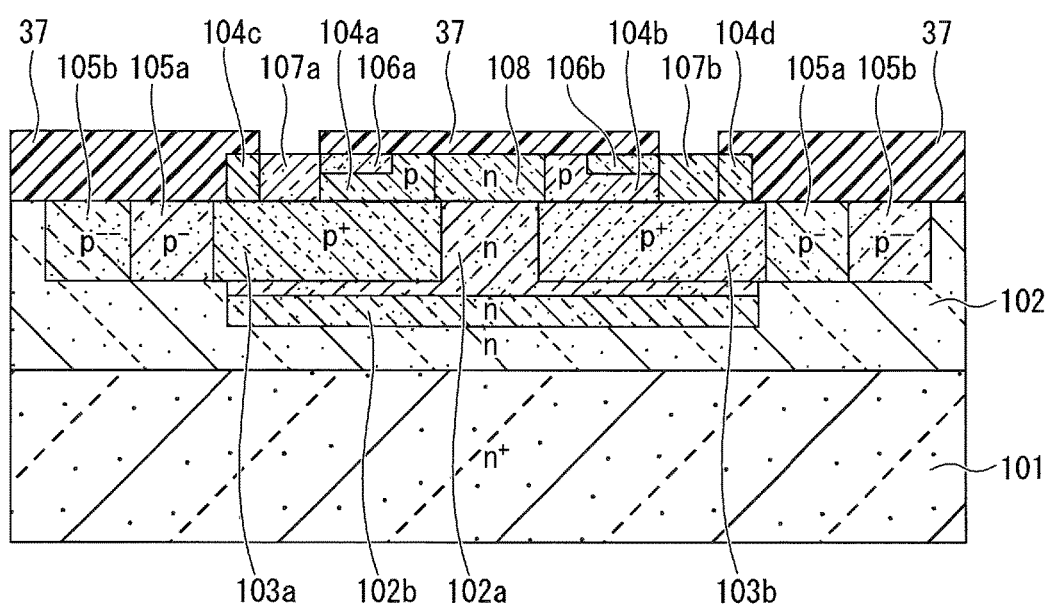
FIG. 16 is a cross-sectional view, continued from FIG. 15B, illustrating the method of manufacturing the semiconductor device according to the second embodiment of the present invention.

Next, a photoresist film 37 is coated on the top surface of the source regions 106a and 106b, the well region 108, and the second base layers 104a and 104b, and is delineated by photolithography. Using the delineated photoresist film 37 as another implantation mask, the epitaxial layer 102 is still further subjected to multiple ion-implantations with p-type impurity ions such as Al ions, so as to selectively form the p$^+$-type base contact regions 107a and 107b in the second base layers 104a and 104b, as illustrated in FIG. 16. The base contact regions 107a and 107b divide the second base layers 104a and 104b into two regions to from the p-type regions 104c and 104d, respectively.

Next, annealing is performed at approximately 1620° C. for approximately two minutes, for example. Accordingly, the ions implanted into the semiconductor region 102a, the semiconductor region 102b, the first base layers 103a and 103b, the source regions 106a and 106b, the base contact regions 107a and 107b, the well region 108, the p$^-$-type region 105a, and the p$^-$-type region 105b are activated, and then, the activated impurity atoms thermally diffuse a slight amount.

The order of fabrication process of the semiconductor region 102a, the semiconductor region 102b, the first base layers 103a and 103b, the source regions 106a and 106b, the base contact regions 107a and 107b, the well region 108, the p$^-$-type region 105a, and the p$^-$-type region 105b is not limited to the flow sequence as described above. Further, the annealing may be independently performed on the semiconductor region 102a, the semiconductor region 102b, the first base layers 103a and 103b, the source regions 106a and 106b, the base contact regions 107a and 107b, the well region 108, the p$^-$-type region 105a, and the p$^-$-type region 105b, sequentially after implanting processes of the specific ions into these regions, respectively.

The following steps of the fabrication process are substantially the same as those in the method of manufacturing the semiconductor device according to the first embodiment as illustrated in FIG. 7B to FIG. 10B, and overlapping explanations thereof are not repeated below.

By the method of manufacturing the semiconductor device according to the second embodiment, a semiconductor device having a minimized on-state resistance can be achieved, while suppressing the lowering of the breakdown voltage.

Other Embodiments

While the present invention has been described above by reference to the first and second embodiments, it should be understood that the present invention is not intended to be limited to the descriptions of the Specification and the Drawings composing part of this disclosure. Various alternative embodiments, examples, and technical applications will be apparent to those skilled in the art according to this disclosure.

While the first and second embodiments have exemplified the structure of the planar and vertical power MOSFET as illustrated in FIG. 1 and FIG. 11, the semiconductor devices according to the present invention are applicable to other architectures other than the structure illustrated in FIG. 1 and FIG. 11. The semiconductor device according to the present invention is not limited to the MOSFET using the oxide film as a gate insulating film, and may also be applicable to a wide-bandgap insulated-gate semiconductor-device, such as MISFET, using a gate insulating film other than the oxide film. Further, the semiconductor device according to the present invention is not limited to the FET, and may also be applicable to other wide-bandgap insulated-gate semiconductor-devices including a static induction transistor (SIT), such as MOSSIT and MISSIT made of wide-bandgap semiconductors. The semiconductor device according to the present invention may further be applicable to a semiconductor device such as High Electron Mobility Transistor (HEMT).

While the first and second embodiments have exemplified the case in which the (000-1) plane is used as the main surface plane of the SiC substrate on which the MOS is formed, the orientation of the main surface plane may be optionally changed freely as appropriate.

While the first and second embodiments have exemplified the double-zone JTE structure as a breakdown structure, a multi-zone JTE structure may also be used in which three or more of p-type regions having different impurity concentrations are arranged in parallel and in contact with each other. Further, a termination structure, such as a field limiting ring (FLR) structure, may be used in which a plurality of p-type regions are arranged at fixed intervals, regardless of the degree of difficulty.

While the first and second embodiments have exemplified the case in which the first conductivity-type is n-type, and the second conductivity-type is p-type, the present invention may also be applicable to the case in which the first conductivity-type is p-type, and the second conductivity-type is n-type.

The present invention can be applicable to various methods of manufacturing various semiconductor devices and various semiconductor fabrication devices used therein, without departing from the scope of the present invention as defined by the following appended claims.

The semiconductor device according to the present invention is effectively applicable to high breakdown-voltage semiconductor-devices for use in power converters and power source devices for industrial machines.

What is claimed is:

1. A semiconductor device, comprising:
   a drain region of a first conductivity-type, made of a semiconductor material having a band gap greater than 2.0 eV at room temperature;
   a first epitaxial layer of the first conductivity-type, provided on a top surface of the drain region and having a lower impurity concentration than the drain region;
   a first semiconductor region of the first conductivity-type, selectively buried in an upper portion of the first epitaxial layer and having a higher impurity concentration than the first epitaxial layer;
   a second semiconductor region of the first conductivity-type, provided on and overlapping with the first semiconductor region in a planar pattern and having a higher impurity concentration than the first semiconductor region, a lowermost surface of the second semiconductor region being lower than an uppermost surface of the first epitaxial layer;

a second epitaxial layer of a second conductivity-type, provided on top of the first epitaxial layer;

a well region of the first conductivity-type, formed in the second epitaxial layer so as to be located above the second semiconductor region, the well region including impurities of the second conductivity-type of the second epitaxial layer and implanted impurities of the first conductivity-type;

a base region of the second conductivity-type, partially located in the second epitaxial layer and partially buried in the second semiconductor region so as to surround the well region and a central upper portion of the second semiconductor region, wherein the central upper portion is vertically protruding in a middle of the second semiconductor region in the planar pattern;

a source region of the first conductivity-type buried in an upper portion of the base region, defining a channel between the source region and the second semiconductor region; and a gate electrode which controls a surface potential of the channel.

2. The semiconductor device of claim 1, wherein a depth of the lowermost surface of the second semiconductor region is at least 0.15 μm greater than that of the base region.

3. The semiconductor device of claim 1, wherein a bottom depth of the first semiconductor region is at least 0.3 μm greater than that of the base region.

4. The semiconductor device of claim 1, wherein, when the impurity concentration of the second semiconductor region is defined as $N_{d1}$ cm$^{-3}$, and the impurity concentration of the first semiconductor region is defined as $N_{d2}$ cm$^{-3}$, a depth of the lowermost surface of the second semiconductor region is at least $5.5 \times 10^3 / N_{d1}^{0.5}$ μm greater than that of the base region, and a bottom depth of the first semiconductor region is at least $6.5 \times 10^3 / N_{d2}^{0.5}$ μm greater than that of the base region.

5. The semiconductor device of claim 1, wherein the base region includes:

a first base layer allocated at a lower portion of the base region, surrounding the central upper portion of the second semiconductor region, and a second base layer located in the second epitaxial layer, the second base layer having a lower impurity concentration than the first base layer, and being in contact with a top surface of the first base layer, wherein the well region is disposed on the central upper portion of the second semiconductor region, wherein the source region is buried in the second base layer so as to define the channel between the source region and the well region.

6. The semiconductor device of claim 5, wherein a depth of the lowermost surface of the second semiconductor region is at least 0.15 μm greater than that of the first base layer.

7. The semiconductor device of claim 5, wherein a bottom depth of the first semiconductor region is at least 0.3 μm greater than that of the first base layer.

8. The semiconductor device of claim 5, wherein, when the impurity concentration of the second semiconductor region is defined as $N_{d1}$ cm$^{-3}$, and the impurity concentration of the first semiconductor region is defined as $N_{d2}$ cm$^{-3}$, a depth of the lowermost surface of the second semiconductor region is at least $5.5 \times 10^3 / N_{d1}^{0.5}$ μm greater than that of the first base layer, and a bottom depth of the first semiconductor region is at least $6.5 \times 10^3 / N_{d2}^{0.5}$ μm greater than that of the first base layer.

9. The semiconductor device of claim 1, further comprising a base contact region of the second conductivity-type having a higher impurity concentration than the base region, the base contact region is selectively buried in the upper portion of the base region so as to contact with the source region.

10. The semiconductor device of claim 1, wherein the second semiconductor region is in contact with an uppermost portion of the first semiconductor region, an uppermost portion of the second semiconductor region reaches an upper surface of the first epitaxial layer and has a higher impurity concentration than that of the uppermost portion of the first semiconductor region, and a depth of the lowermost surface of the second semiconductor region is greater than that of the base region.

11. The semiconductor device of claim 1, wherein the impurity concentration of the second semiconductor region is substantially constant from an uppermost surface of the second semiconductor region to the lowermost surface of the second semiconductor region, the uppermost surface of the second semiconductor region being at the uppermost surface of the first epitaxial layer.

* * * * *